(12) United States Patent
Perez et al.

(10) Patent No.: US 7,715,176 B2
(45) Date of Patent: May 11, 2010

(54) MODULAR POWER MONITORING SYSTEM

(76) Inventors: Marcelo A. Perez, 24 Prescott Pl., Franklin, TN (US) 37069; E. Avery Ashby, 2032 Sterling St., Murfreesboro, TN (US) 37127; Jon A. Bickel, 3123 Monarch Dr., Murfreesboro, TN (US) 37129; Larry E. Curtis, 118 Marauder Ct., Murfreesboro, TN (US) 37127; James F. Clark, 506 Richard Rd., Murfreesboro, TN (US) 37129

( * ) Notice: Subject to any disclaimer, the term of this patent is extended or adjusted under 35 U.S.C. 154(b) by 429 days.

(21) Appl. No.: 11/803,961

(22) Filed: May 16, 2007

(65) Prior Publication Data

US 2008/0284614 A1 Nov. 20, 2008

(51) Int. Cl.
*H02B 1/00* (2006.01)
*G01R 21/00* (2006.01)
(52) U.S. Cl. ................ 361/664; 361/659; 361/660; 702/62
(58) Field of Classification Search ........... 361/600, 361/634, 636, 652–654, 659, 660, 664–669, 361/673, 679; 211/94.01, 94.26, 162; 174/50.54, 174/52.5, 50.5; 340/156, 157, 509, 521, 340/870.02, 870.03; 324/114, 115, 117 R, 324/142; 312/223.2, 223.3, 236
See application file for complete search history.

(56) References Cited

U.S. PATENT DOCUMENTS 3,599,910 A 8/1971 Wipff et al.

(Continued)

FOREIGN PATENT DOCUMENTS

DE 202 16 393 1/2003

(Continued)

OTHER PUBLICATIONS

Socomec Group, "Operating Instructions for DIRIS Model A40/A41," Installation instructions, p. 10, date unknown (71 pages).

(Continued)

*Primary Examiner*—Michael V Datskovskiy

(57) ABSTRACT

A power monitoring system for monitoring characteristics of power transmitted through one or more power lines comprises a meter base and multiple option modules. The meter base includes a processor and associated circuitry for processing signals derived from sensors coupled to said power lines and producing output signals representing selected characteristics of the power transmitted through the power lines, and a housing containing the processor and the associated circuitry and having a first surface adapted to be mounted on a DIN rail, and a second surface containing multiple connectors for receiving multiple modules and electrically connecting the modules to the processor and the associated circuitry. Each of the multiple option modules includes a housing having a first surface containing a connector that is complementary with the multiple connectors in the second surface of the meter base so that any of the option modules can be plugged into any of the multiple connectors in the second surface of the meter base, and circuitry within the housing of the option module for interconnecting with the processor and the associated circuitry in the meter base. The first surface of the meter base housing may be adapted for optional mounting on the DIN rail or a flat panel, and contains a connector for mating with a complementary connector on the opposite side of the flat panel through a hole in the flat panel.

12 Claims, 29 Drawing Sheets

U.S. PATENT DOCUMENTS

| | | | |
|---|---|---|---|
| 3,828,291 A | 8/1974 | Urani | |
| 4,041,358 A * | 8/1977 | Donahue et al. | 361/660 |
| 4,148,542 A | 4/1979 | Wood | |
| 4,440,368 A | 4/1984 | Kitchen | |
| 4,532,486 A | 7/1985 | Terrier | |
| 4,672,508 A | 6/1987 | Bridges | |
| 4,695,913 A | 9/1987 | Terracol et al. | |
| 4,716,496 A | 12/1987 | Fritsch | |
| 4,734,639 A | 3/1988 | Saletta et al. | |
| 4,962,443 A | 10/1990 | Cole | |
| 5,068,763 A * | 11/1991 | Brown et al. | 361/659 |
| 5,586,909 A | 12/1996 | Saba | |
| 5,602,363 A * | 2/1997 | Von Arx | 174/559 |
| 6,109,575 A | 8/2000 | Munson | |
| 6,181,548 B1 | 1/2001 | Wheeler | |
| 6,329,810 B1 | 12/2001 | Reid | |
| 6,483,289 B2 | 11/2002 | Reid | |
| 6,563,697 B1 * | 5/2003 | Simbeck et al. | 361/668 |
| 6,713,997 B2 | 3/2004 | Carlson et al. | |
| 6,871,150 B2 * | 3/2005 | Huber et al. | 702/62 |
| 7,090,454 B2 | 8/2006 | Shain | |
| 7,184,904 B2 * | 2/2007 | Kagan | 702/62 |
| 7,191,076 B2 * | 3/2007 | Huber et al. | 702/62 |
| 7,265,966 B2 * | 9/2007 | Dudley | 361/659 |
| 7,362,232 B2 * | 4/2008 | Holle et al. | 340/667 |
| 7,447,998 B2 * | 11/2008 | Hutcheson et al. | 715/777 |
| 2007/0067119 A1 * | 3/2007 | Loewen et al. | 702/57 |

FOREIGN PATENT DOCUMENTS

| | | |
|---|---|---|
| EP | 0248137 A1 * | 12/1987 |
| EP | 0 598 521 | 5/1994 |
| GB | 2300720 A * | 11/1996 |

OTHER PUBLICATIONS

Merlin Gerin, "Technical Data Sheet 2003 Power-monitoring Unit PowerLogic System for Power Meter PM500," Installation and Connection, p. 7, 2003 (8 pages).

* cited by examiner

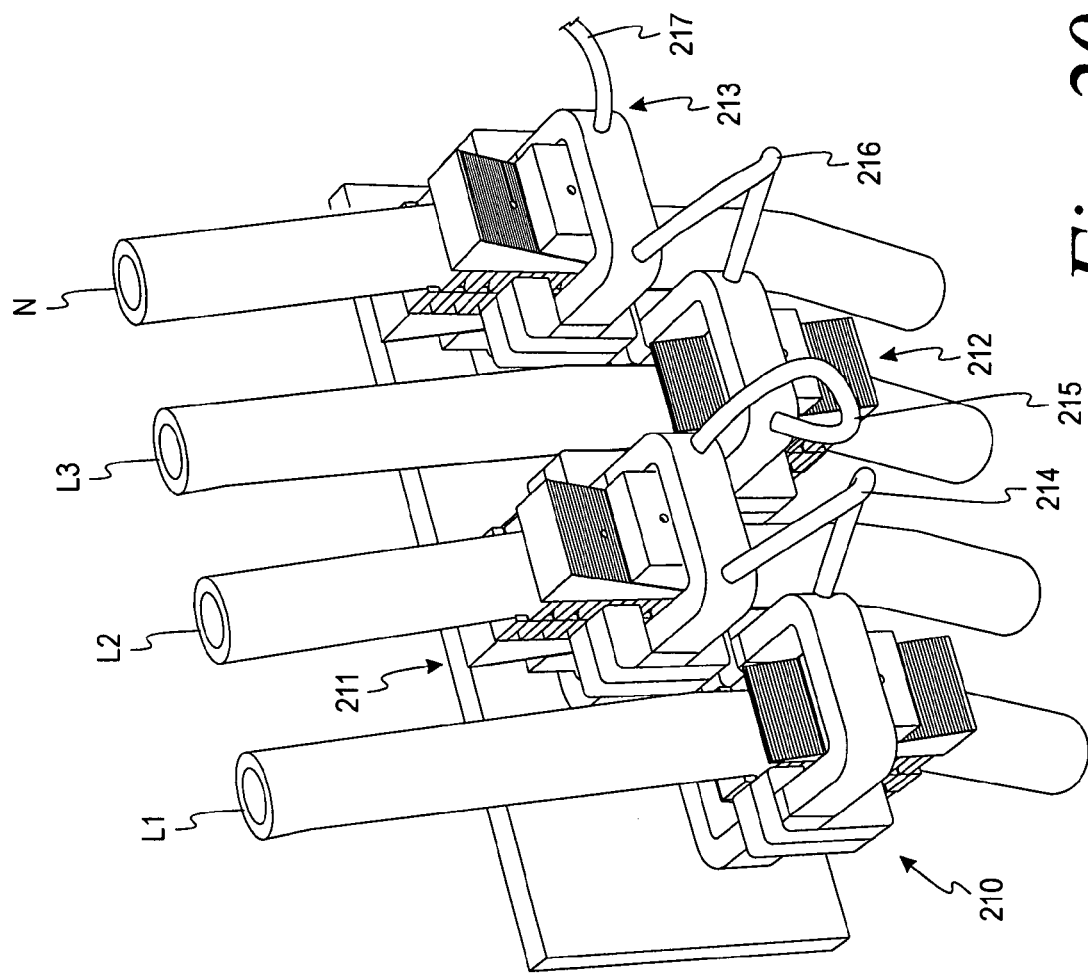

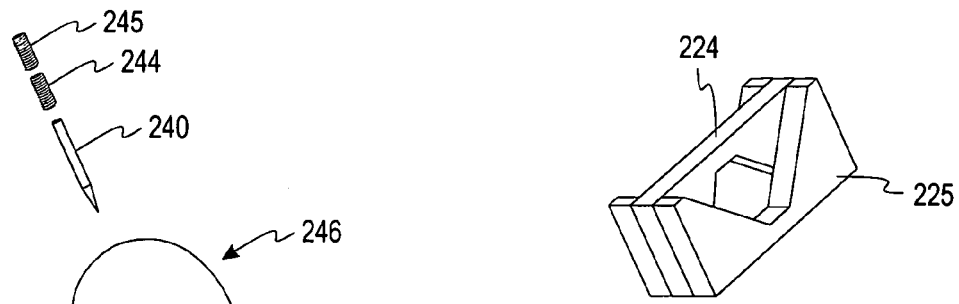
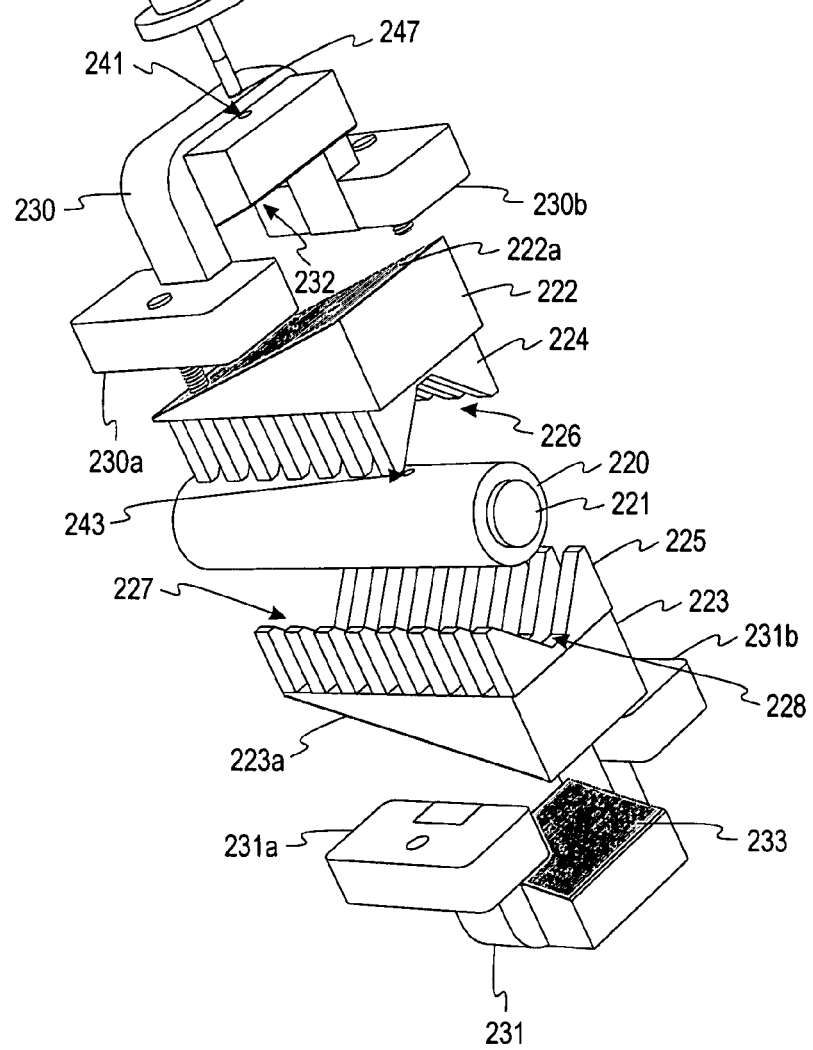
Fig. 21b
Fig. 21a

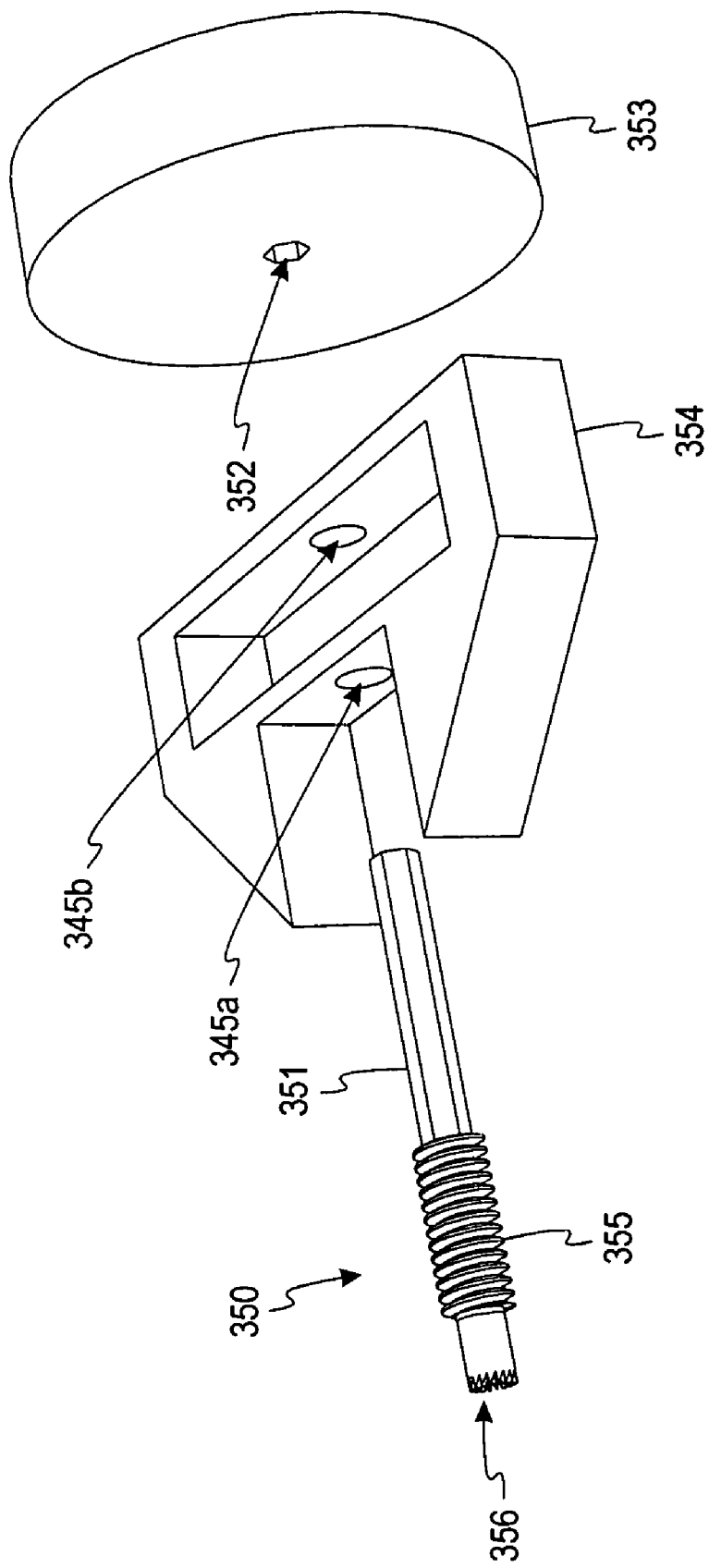

MODULAR POWER MONITORING SYSTEM

FIELD OF THE INVENTION

The present invention relates to power monitoring systems for monitoring characteristics of power transmitted through one or more power lines.

SUMMARY OF THE INVENTION

In one embodiment, a power monitoring system for monitoring characteristics of power transmitted through one or more power lines, said power monitoring system comprises a meter base and multiple option modules. The meter base includes a processor and associated circuitry for processing signals derived from sensors coupled to said power lines and producing output signals representing selected characteristics of the power transmitted through the power lines, and a housing containing the processor and the associated circuitry and having a first surface adapted to be mounted on a DIN rail, and a second surface containing multiple connectors for receiving multiple modules and electrically connecting the modules to the processor and the associated circuitry. Each of the multiple option modules includes a housing having a first surface containing a connector that is complementary with the multiple connectors in the second surface of the meter base so that any of the option modules can be plugged into any of the multiple connectors in the second surface of the meter base, and circuitry within the housing of the option module for interconnecting with the processor and the associated circuitry in the meter base. The first surface of the meter base housing may be adapted for optional mounting on the DIN rail or a flat panel, and contains a connector for mating with a complementary connector on the opposite side of the flat panel through a hole in the flat panel. In another mounting configuration of the same device, the option modules are mounted on the DIN rail and stack up on the end of the meter base through pass-through connectors or via connectors on a backplane.

In one preferred form factor, the DIN rail is elongated horizontally, and the meter base housing and the option module housings have a horizontal dimension that is an integer multiple of a predetermined dimension, so that the housings are all compatible and interchangeable with associated equipment having horizontal dimensions that are integer multiples of the predetermined dimension.

In one specific embodiment, the option modules include a display module for receiving the output signals and displaying the selected characteristics of the electrical power system. The display includes a display screen and associated circuitry for receiving the output signals, and a housing having a front surface surrounding the display screen, and a rear surface adapted to be mounted on a flat panel and containing a connector coupled to the circuitry associated with the display screen and mating with a display connector on the first surface of the meter module housing so that the metering module and the display can be mounted on opposite sides of the same panel and connected to each other through an aperture in the panel. The meter base and the display may also include connectors for making a tethered connection between the meter base and the display.

In another specific embodiment, the power monitoring system includes a current-voltage module comprising a housing, at least one pair of terminals mounted on the housing for connecting the housing to the power lines, a voltage sensor contained in the housing and coupled to the terminals for producing a signal representing the voltage across the power lines, a current sensor contained in the housing and coupled to the terminals for producing a signal representing the current carried by the power lines, analog-to-digital converters contained in the housing and receiving the voltage and current signals for producing corresponding digital signals, and at least one digital signal output terminal receiving the corresponding digital signals from the analog-to-digital converters for supplying the digital signals to the processor for analyzing those digital signals. The current-voltage module housing may include a surface forming a channel that is sized and shaped to mate with a complementary DIN rail for mounting the current-voltage module housing on the DIN rail.

One embodiment of the current-voltage module includes multiple voltage sensors, current sensors and analog-to-digital converters, and the multiple analog-to-digital converters are daisy-chained to the digital signal output terminal to provide a serial output containing the outputs of all of the multiple analog-to-digital converters.

One particular embodiment of the current-voltage module includes a voltage protection device for protecting the circuitry in the current-voltage module from voltage transients on the power lines. The current-voltage module may also include circuitry for converting an AC voltage on the power line to a low-voltage DC power output.

BRIEF DESCRIPTION OF THE DRAWINGS

The foregoing and other advantages of the invention will become apparent upon reading the following detailed description and upon reference to the drawings.

FIG. 20 is a perspective view of a set of four clamp-on current and voltage modules installed on the four conductors of a three-phase power distribution system.

FIG. 21 is an enlarged, exploded perspective view of one of the clamp-on current and voltage modules shown in FIG. 20, along with a tool used in the installation of the module.

FIG. 31 is a further enlarged perspective view of the voltage sensor shown in FIG. 11.

DETAILED DESCRIPTION OF PREFERRED EMBODIMENTS

Although the invention will be described in connection with certain preferred embodiments, it will be understood that the invention is not limited to those particular embodiments. On the contrary, the invention is intended to cover all alternatives, modifications, and equivalent arrangements as may be included within the spirit and scope of the invention as defined by the appended claims.

Meter Base

Figure 1:
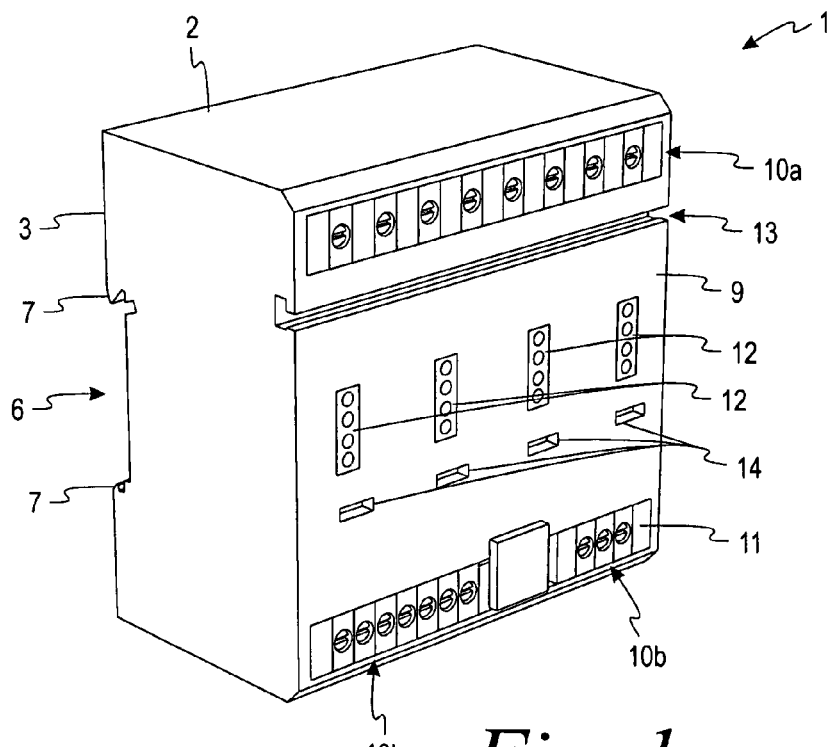
FIG. 1 is a front perspective of a meter base used in one embodiment of the invention.
Figure 2:
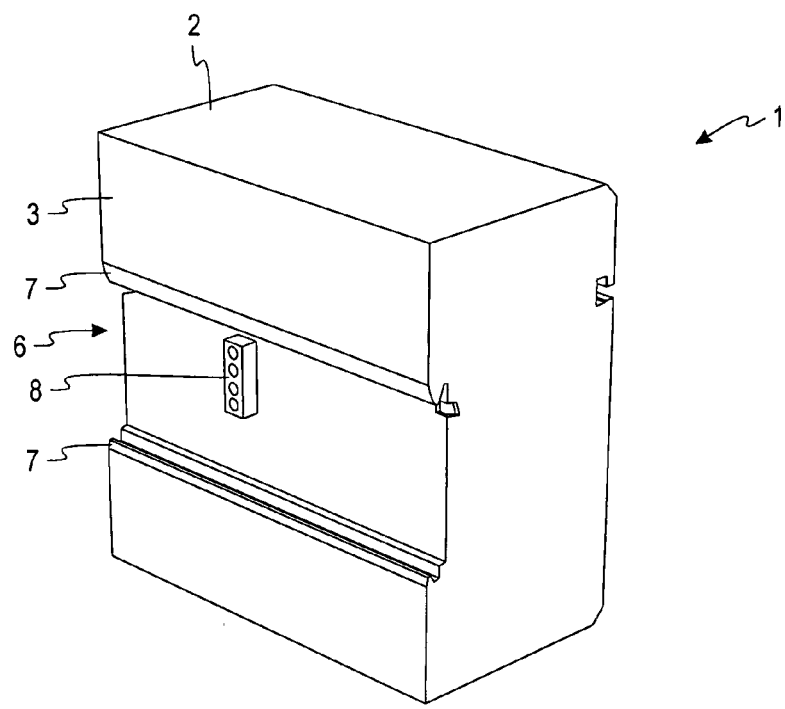
FIG. 2 is a rear perspective of the meter base of FIG. 1.
Figure 5:
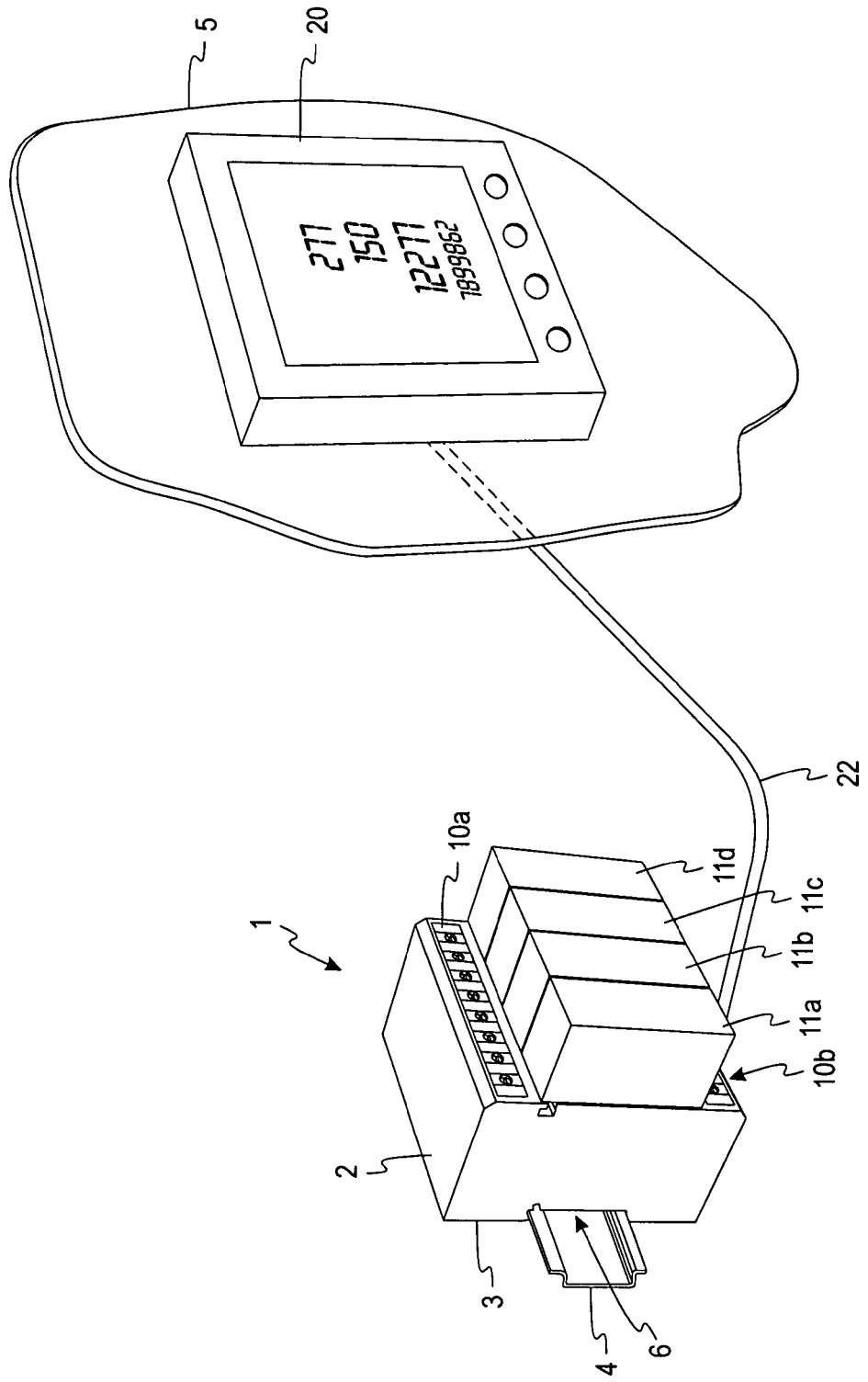
FIG. 5 is a front perspective of the meter base and option modules of FIG. 3 mounted on a DIN rail and connected to the display module of FIG. 4 mounted on a flat panel.
Figure 6:
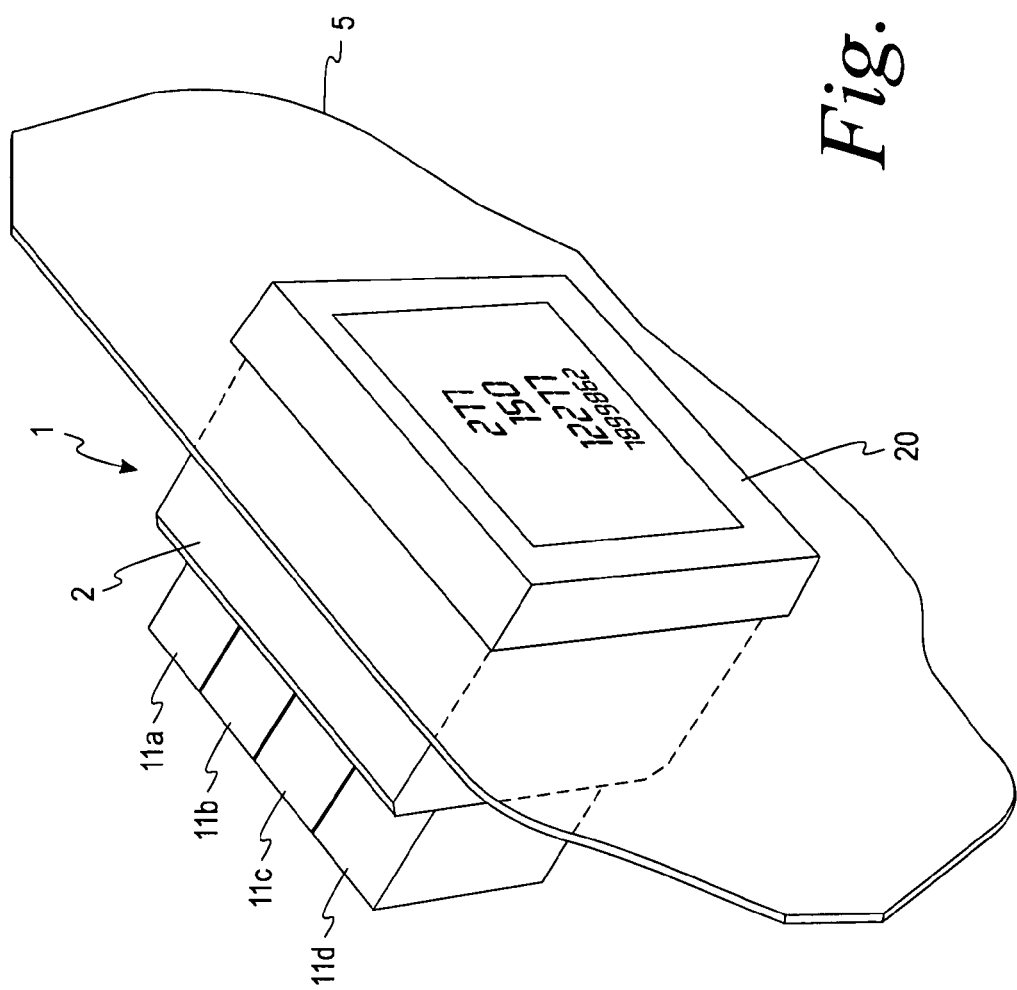
FIG. 6 is a front perspective of the meter base and option modules of FIG. 3 mounted on the rear surface of a flat panel and connected to the display module of FIG. 4 mounted on the front surface of the same panel.

Turning now to the drawings and referring first to FIGS. 1 and 2, the central module of one embodiment of a modular power monitoring system is a meter base 1. The meter base 1 includes a housing 2 having a rear mounting surface 3 adapted to be mounted on either a DIN rail 4, as depicted in FIG. 5, or on the inside surface of a flat panel 5, such as the door of a conventional enclosure for power monitoring equipment, as depicted in FIG. 6. For mounting on a DIN rail, the mounting surface 3 forms a horizontal channel 6 that is complementary with the DIN rail, with flanges 7 along at least portions of the longitudinal edges of the channel 6 for receiving and capturing the corresponding longitudinal edges of the DIN rail 4. Standard DIN rail clips may also be used to secure the meter base 1 to the DIN rail 4. A connector 8 is mounted within the channel 6 for receiving a complementary connector, for applications described in detail below.

Figure 3:
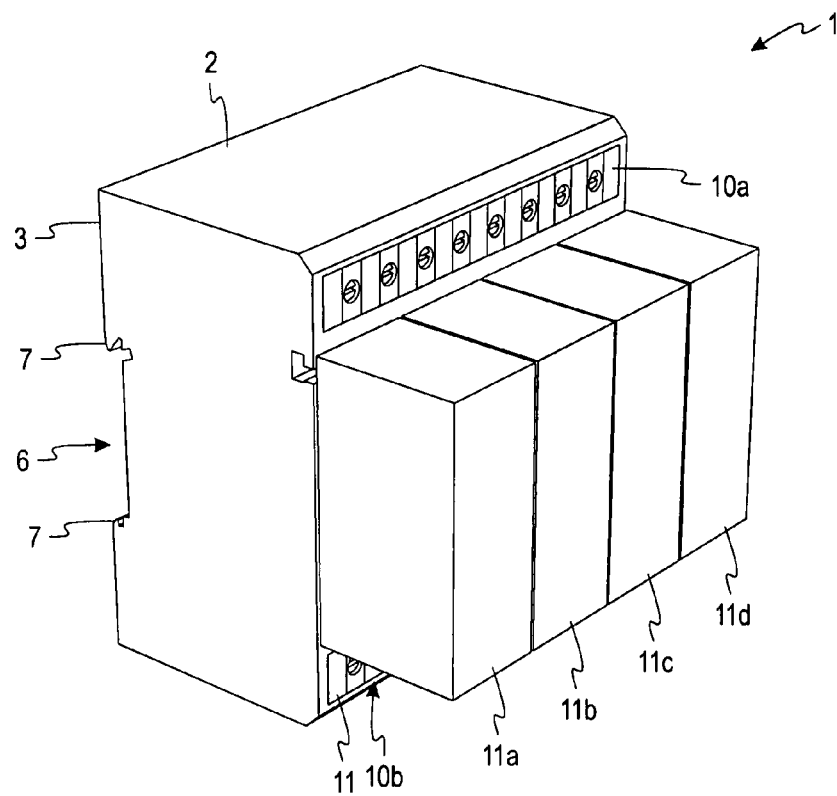
FIG. 3 is the meter base shown in FIG. 1 with four option modules plugged into connectors built into the front wall of the meter base.

The opposite surface 9 of the housing 2 includes upper and lower rows of screw terminals 10a and 10b for attachment to current and voltage lines. In addition, multiple connectors 12 are provided in the surface 9 for receiving mating connectors on option modules 11a-11d (see FIG. 3) which can be easily attached to, and detached from, the meter base 1. These option modules 11 permit the power monitoring system to be modified to add, or eliminate, various functions provided by different option modules. Detached option modules 11 may be re-attached after servicing, or replaced for maintenance purposes or to upgrade or downgrade the power monitoring system. In the illustrative example, the meter base 1 is designed to accommodate four option modules 11a-11d, but it will be recognized that the design of the meter base can be altered to accommodate more, or fewer, option modules. The option modules 11 will be described in more detail below. There is a channel 13 that runs the length of surface 9 and openings 14 below each option module connector 12 for use in attaching the option modules to the meter base 1.

In one embodiment, the meter base 1 and the option modules 11 are dimensioned to satisfy the requirements of a standard "Multi 9" system, which means that the width of each module is a multiple of 9 mm. For example, the meter base may have a width of 90 mm., and each option module may have a width of 18 mm.

Figure 4:
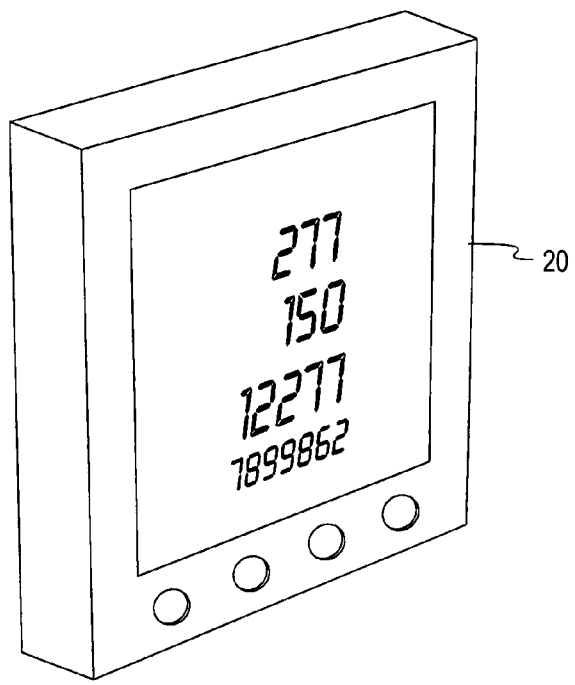
FIG. 4 is a front perspective of a display module adapted to be connected to the meter base by a cable providing operating power from the meter to the display and serial communications between the meter and the display.

FIG. 4 depicts a display module 20 for use with the meter base 1, and FIG. 5 illustrates the display module 20 mounted on the front surface of a flat panel 5, which may be the door of an enclosure for the power monitoring equipment. The meter base 1 is mounted on the DIN rail 4, and both data and power are supplied to the display module 20 from the meter base 1 through a cable 22.

FIG. 6 illustrates the meter base 1 having its mounting surface 3 attached to the inside surface of the same panel 5 on which the display module 20 is mounted. The display module 20 is equipped with a connector that mates with the connector 8 on the mounting surface 3 of the meter base 1, so that the display module can be plugged directly into the connector 8, through a hole formed in the intervening panel 5.

Figure 7:
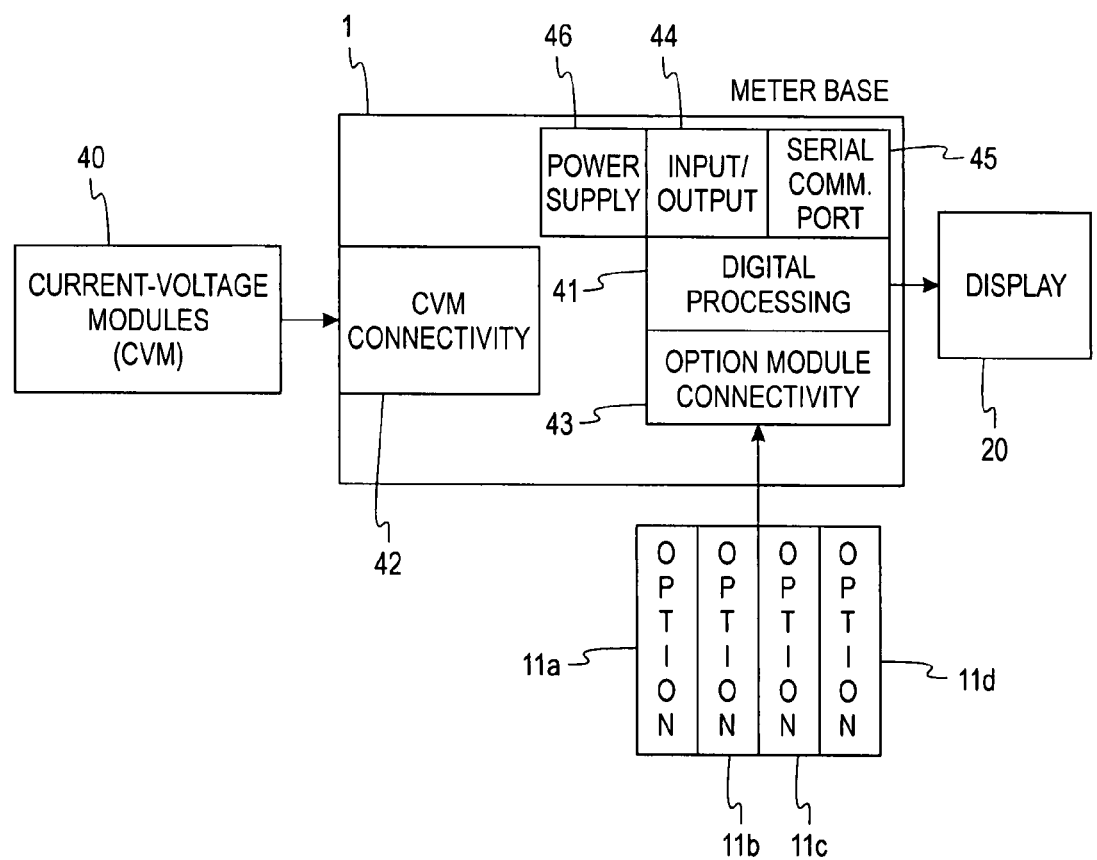
FIG. 7 is a block diagram of the internal architecture of one embodiment of the meter base and option modules of FIG. 3 receiving input signals from a current-voltage module and producing output signals to a display unit.

The meter base 1 contains a processor and associated circuitry that can be adapted for use with a current-voltage module ("CVM," described in detail below) or for stand-alone use with electronic current transformers. FIG. 7 illustrates the internal architecture of a meter base 1 adapted for use with a CVM 40. The meter base 1 contains a digital processor 41 that receives current and voltage signals from the CVM 40 via connection circuitry 42. The processor 41 may also receive input signals from option modules 11a-11d via connecting circuitry 43, and may receive and transmit communication signals via an I/O port 44 and a serial communication port 45 for communicating with a display module 20 or remote equipment, such as work stations networked with the power monitoring equipment. A DC power supply 46 for the processor 41 receives AC power from the CVM and produces a DC power output.

Figure 8:
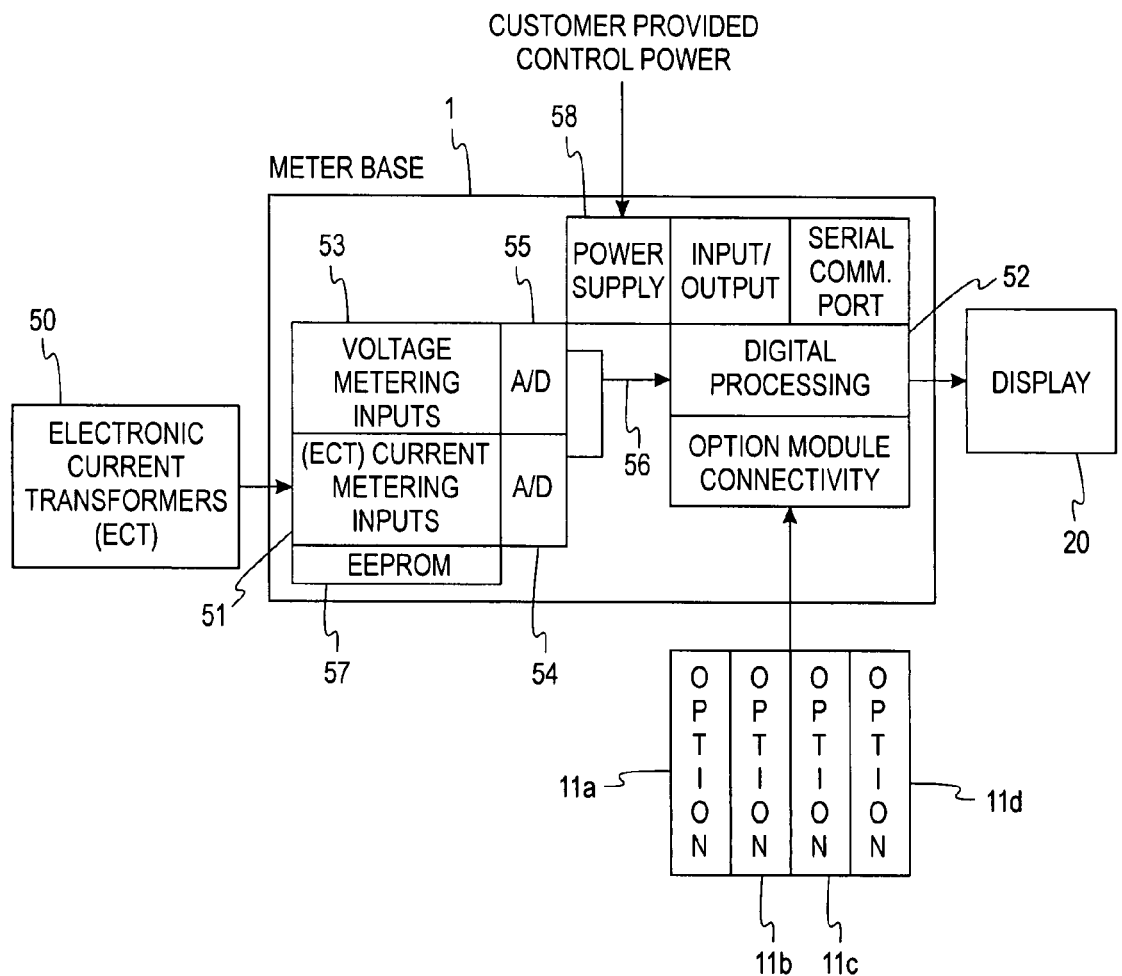
FIG. 8 is a block diagram of the internal architecture of another embodiment of the meter base and option modules of FIG. 3 receiving input signals from current transformers and producing output signals to a display unit.

FIG. 8 illustrates the internal architecture of a meter base 1 adapted for stand-alone use with electronic current transformers ("ECT") 50. The ECT's 50 respond to the current flowing in power conductors to produce corresponding voltage output signals that are fed into current-metering inputs 51, which may include protection devices to protect the downstream circuitry, including the processor 52, from power line transients and the like. Voltage signals are received by voltage metering inputs 53, which typically include voltage dividers to reduce the levels of the voltages being monitored.

The current and voltage signals are passed through analog-to-digital ("A/D") converters 54 and 55 to convert the analog signals from the ECT's 50 to corresponding digital signals that can be used by the digital processor 52. The outputs of the A/D converters 54 and 55 are transmitted through lines 56 to the processor 52, which uses the digital current and voltage signals to analyze the power being supplied to the load, and to generate the outputs required for desired displays, reports and remote communications. The meter base 1 also contains a memory device, such as the EEPROM 57 depicted in FIG. 8, for storing data identifying the meter base and its electrical characteristics. For this stand-alone version of the meter base, DC power is supplied to the power supply 58 from an external source.

Figure 9:
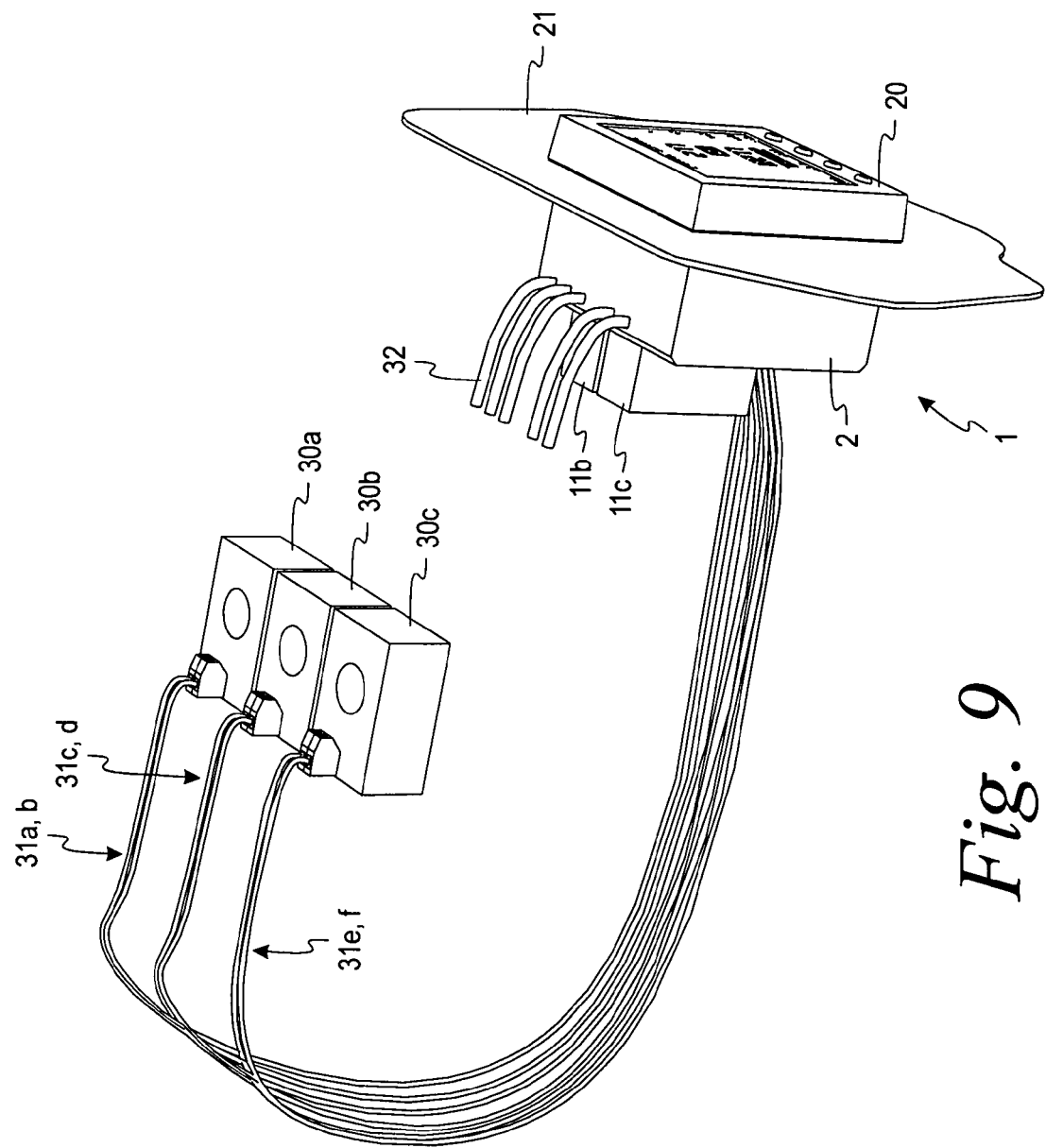
FIG. 9 is a front perspective of the meter base and option modules of FIG. 6 connected to a set of electronic current transformers.

FIG. 9 illustrates the same meter base/display module combination shown in FIG. 6, with the meter base 1 connected to three current transformers 30a, 30b and 30c, which are preferably current transformers that comply with the IEC Standard 60044-8. Each of the current transformers 30a-30c is connected to the meter base 1 by a pair of insulated conductors 31a and 31b, 31c and 31d, or 31e and 31f. Voltage signals are supplied to the meter base via voltage lines 32 connected to the same power conductors that are coupled to the current transformers 30a-30c.

Current-Voltage Module

Figure 10A:
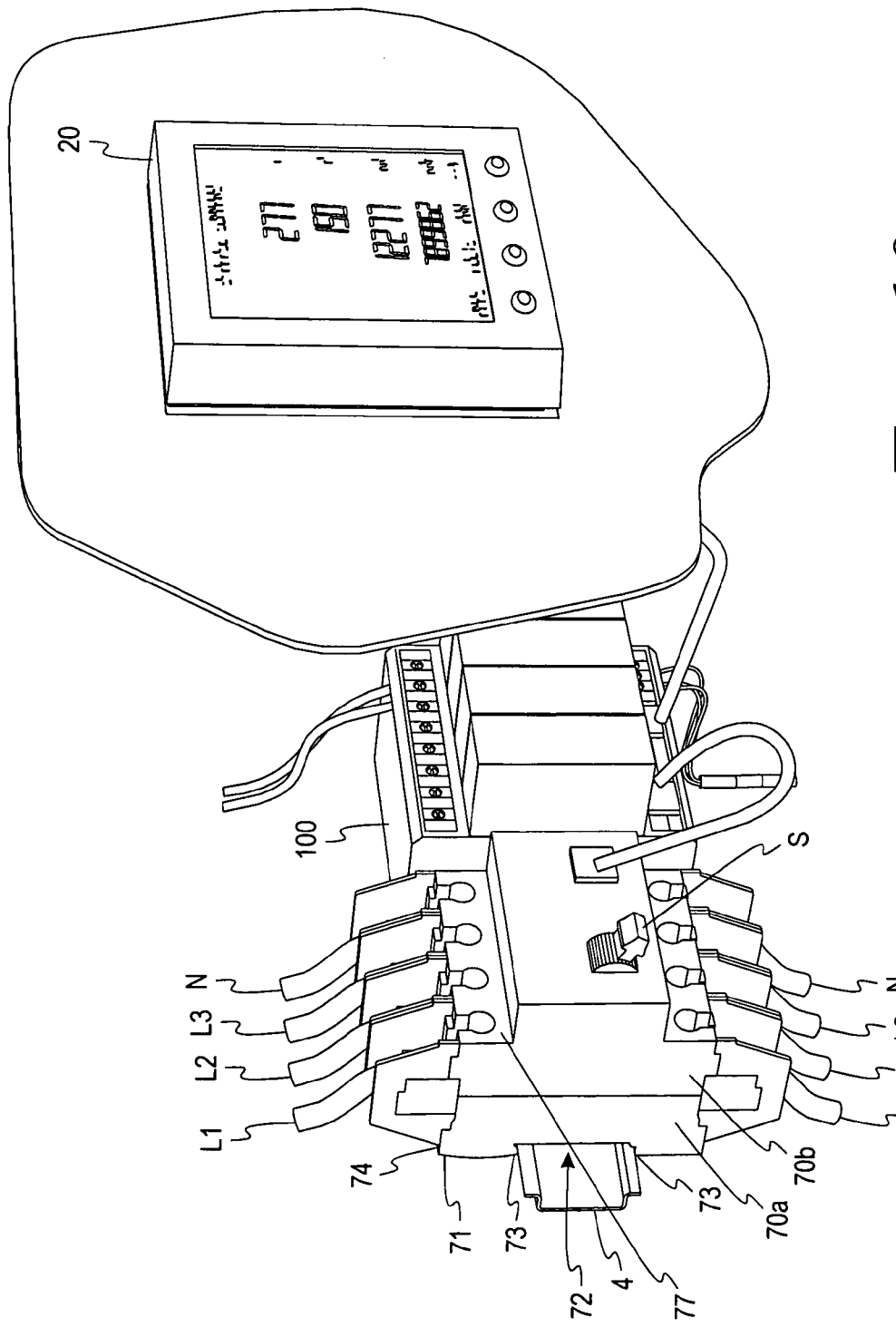
FIG. 10 is a front perspective of one embodiment of a current-voltage module mounted on a DIN rail along with a second embodiment of a display module.

FIG. 10 illustrates one embodiment of a current-voltage module ("CVM") mounted on a standard DIN rail 4. The illustrative CVM includes a housing 70 (formed in two sections 70a and 70b) having a mounting surface 71 forming a horizontal channel 72 that is complementary with the DIN rail 4, with flanges 73 along at least portions of the longitudinal edges of the channel 72 for receiving and capturing the corresponding longitudinal edges of the DIN rail. Standard DIN rail clips may also be used to secure the housing 70 to the DIN rail 4. To satisfy the "Multi 9" form factor, the housing 70 may have a width of 90 mm. An on-off switch S is provided on the front of the housing 70. In another embodiment, this switch can be completely hidden from the user and actuated automatically when the section 70b of the CVM housing 70 is removed from the equipment.

In the illustrative embodiment, the CVM housing 70 is split in two sections 70a and 70b parallel to the back plane of the DIN rail 4. The section 70a closer to the DIN rail 4 can be left in the equipment if any of the remaining parts of the CVM or meter must be removed from the installation. Before removing the section 70b of the CVM housing 70, the switch S is moved to the off position. In this position, the line side and the load side of the power conductors are connected through a shorting block 89b and shunt 89a within the housing 70. The shorting block 89b is contained in the section 70a of the CVM housing that is closer to the DIN rail 4, and thus can remain in place while the rest of the CVM is removed.

The top and bottom surfaces 74 and 75 of the CVM housing 20 each contain a row of four screw terminals, respectively, for connecting the CVM to the four power conductors L1, L2, L3 and N of a three-phase power distribution system. The upper terminals are connected to the line side of the power conductors, and the lower terminals are connected to the load side of the power conductors. Inside the CVM housing 70, the upper and lower terminals are connected by a conductive shunt 89a and a shorting block 89b, four of which can pass through conventional current transformers 76 depicted in FIGS. 11 and 12. The current transformers 76 respond to the current flowing in the four power conductors L1-L3 and N to produce corresponding current output signals that can be used to analyze the power being supplied to the load. Voltage signals are derived from the power conductors L1, L2, L3 and N though a direct connection into the shunts 89a.

Figure 11:
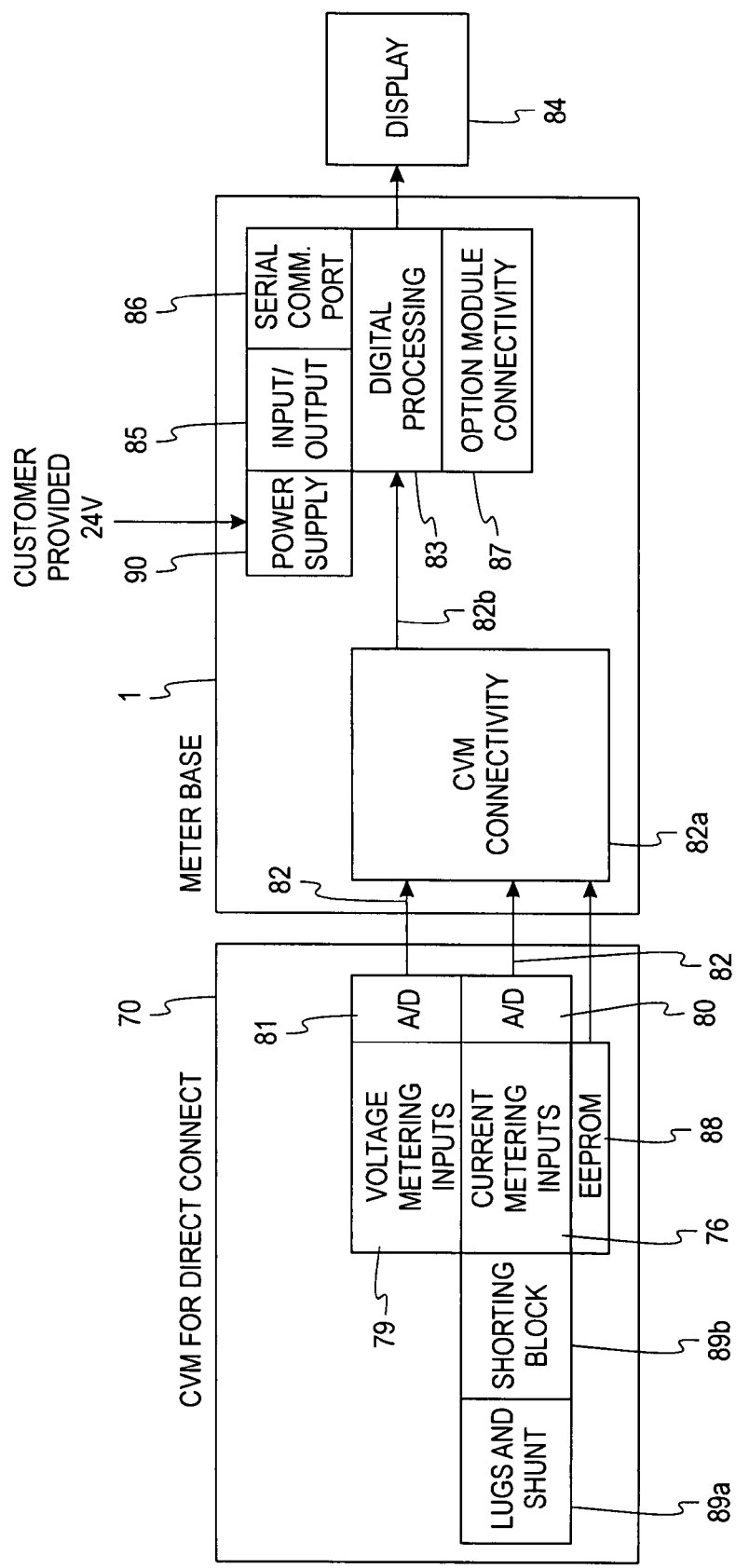
FIG. 11 is a block diagram of the internal architecture of one embodiment of the current-voltage module of FIG. 10.
Figure 12:
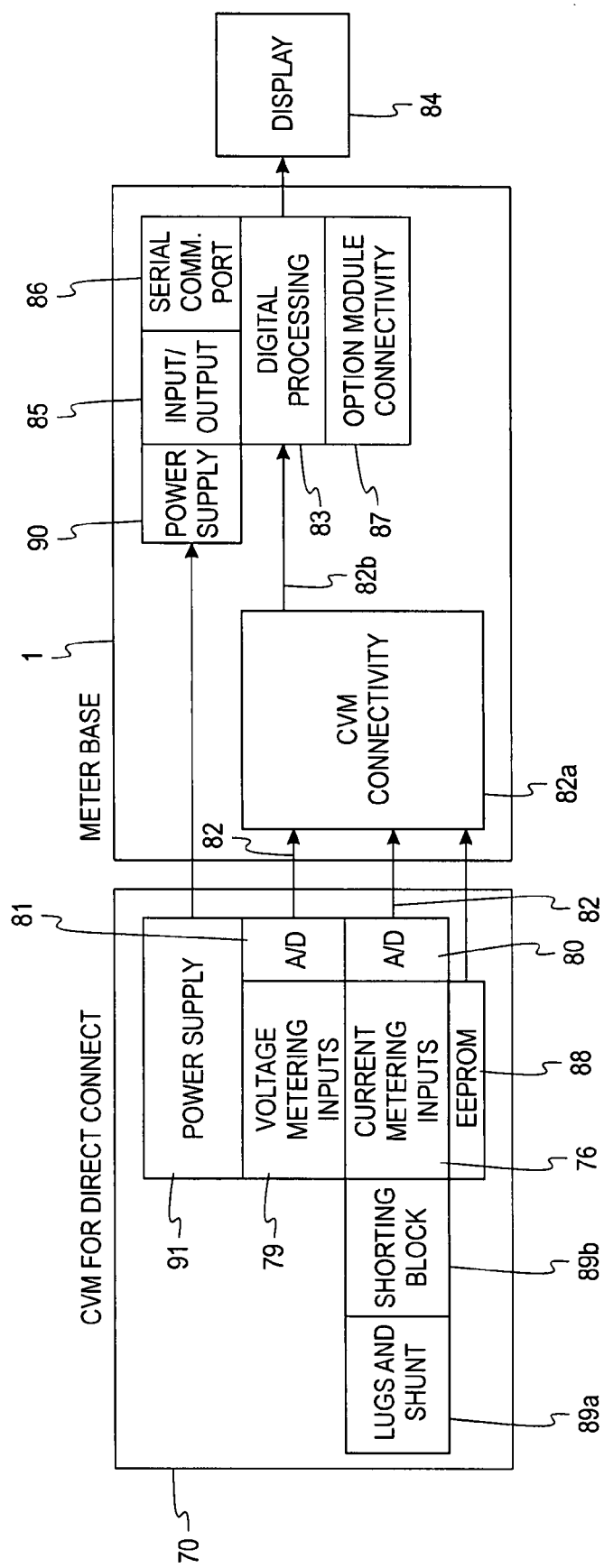
FIG. 12 is a block diagram of the internal architecture of a second embodiment of the current-voltage module of FIG. 10.

As depicted in FIGS. 11 and 12, the current and voltage output signals are passed through analog-to-digital ("A/D") converters 80 and 81 to convert the analog signals from the sensors to corresponding digitals signals that can be used by a digital processor. The outputs of the A/D converters 80 and 81 are transmitted through lines 82 to CVM connectivity circuitry 82a in the meter base 1, and then on through a line 82b to a digital processor 83 that uses the current and voltage signals to analyze the power being supplied to the load. The processor 83 generates the outputs required for desired displays, reports and remote communications. Display output signals are fed to a display module 84, and signals to be transmitted to other equipment are fed to an I/O port 85, a serial communication port 86, and/or an option module connector 87.

The CVM housing 70 also contains a memory device, such as the EEPROM 88 depicted in FIGS. 11 and 12, for storing data identifying the CVM and its electrical characteristics. For example, the memory device may include data representing the serial number and manufacturing date for the CVM, the number and types of current and/or voltage sensors used, their input/output characteristics, and the characteristics of the output signals from the A/D converters. The CVM typically contains components that need to be calibrated or characterized by a calibration procedure, and the results of such calibration procedures can be stored in the EEPROM 88 for transmission to the meter base to which the CVM is ultimately connected, so that the calibration results can be factored into the computations performed in the meter base. In the event that the module is removed for servicing and re-calibrated, the new calibration results are stored in the EEPROM 88 and transmitted to the meter base 1 when the serviced module is plugged into the meter base.

When the CVM is initially connected to the meter base 1, the data in the EEPROM 88 is automatically transmitted to the digital processor in the meter base via the serial input line 82. The digital processor 83 in the meter base 1 is programmed to automatically make any adjustments required to process the signals received from the specific CVM identified by the data stored in the EEPROM 88 of that CVM, thereby permitting the same base meter 1 to be used with different CVM modules.

Figure 10B:
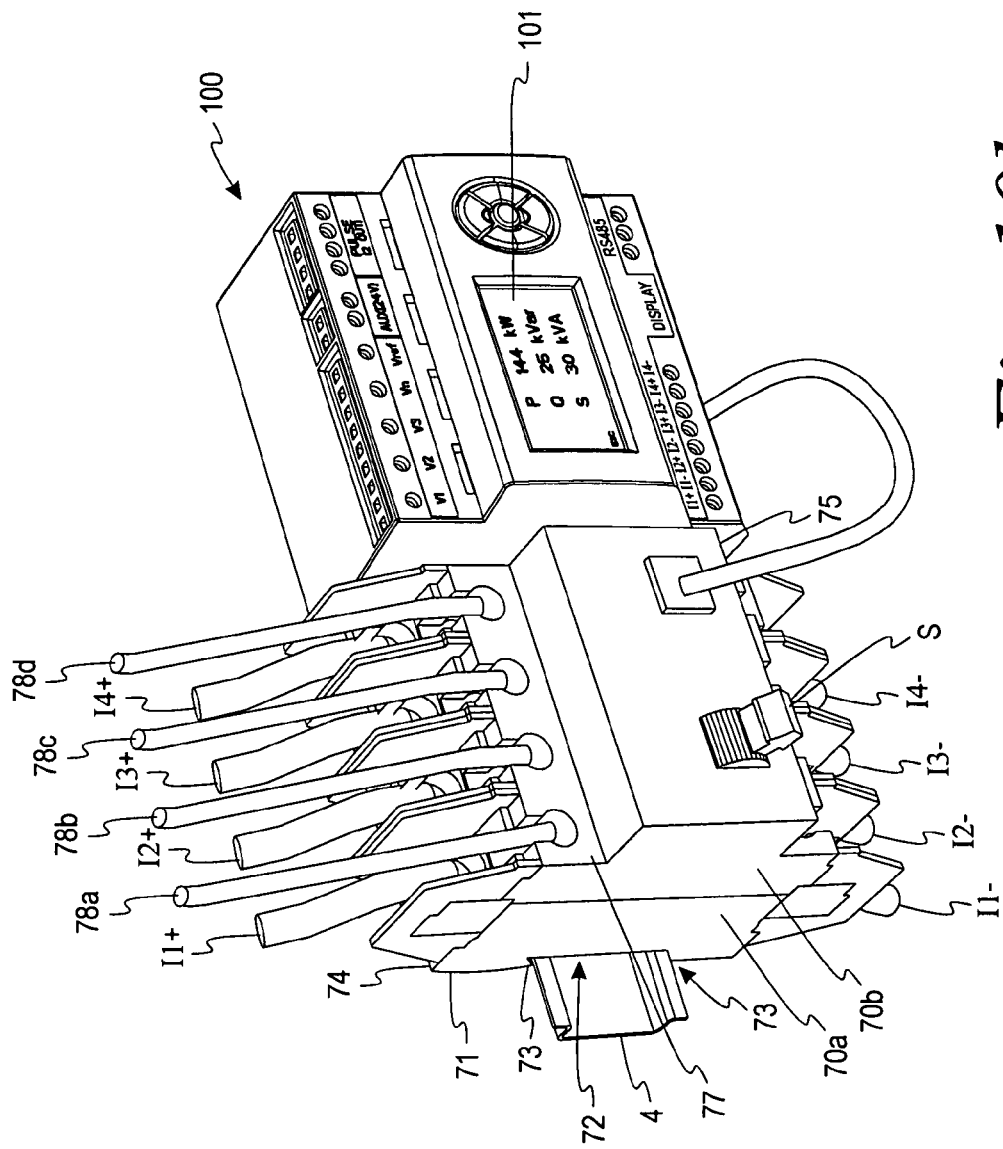
Figure 13:
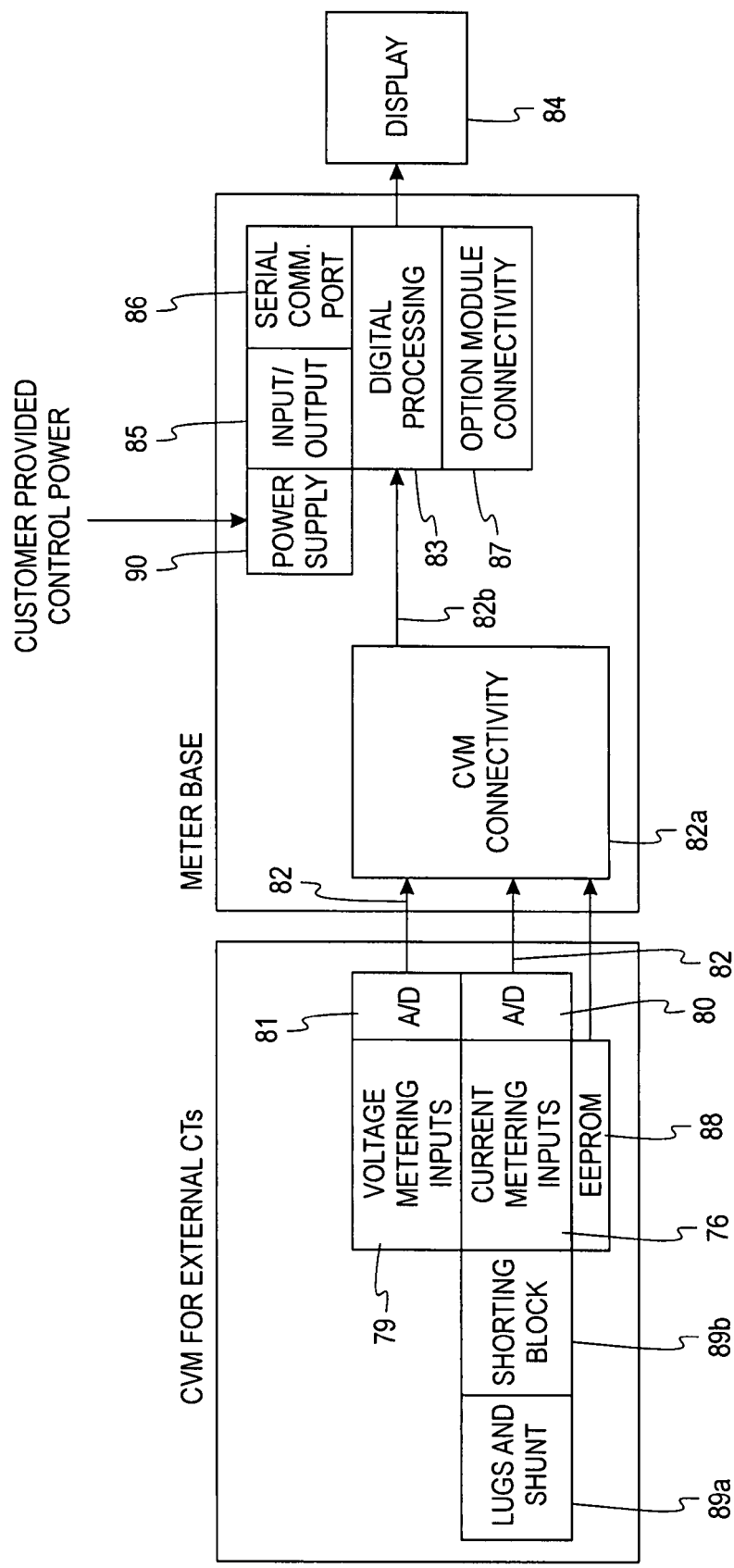
FIG. 13 is a block diagram of the internal architecture of a third embodiment of the current-voltage module of FIG. 10.
Figure 14:
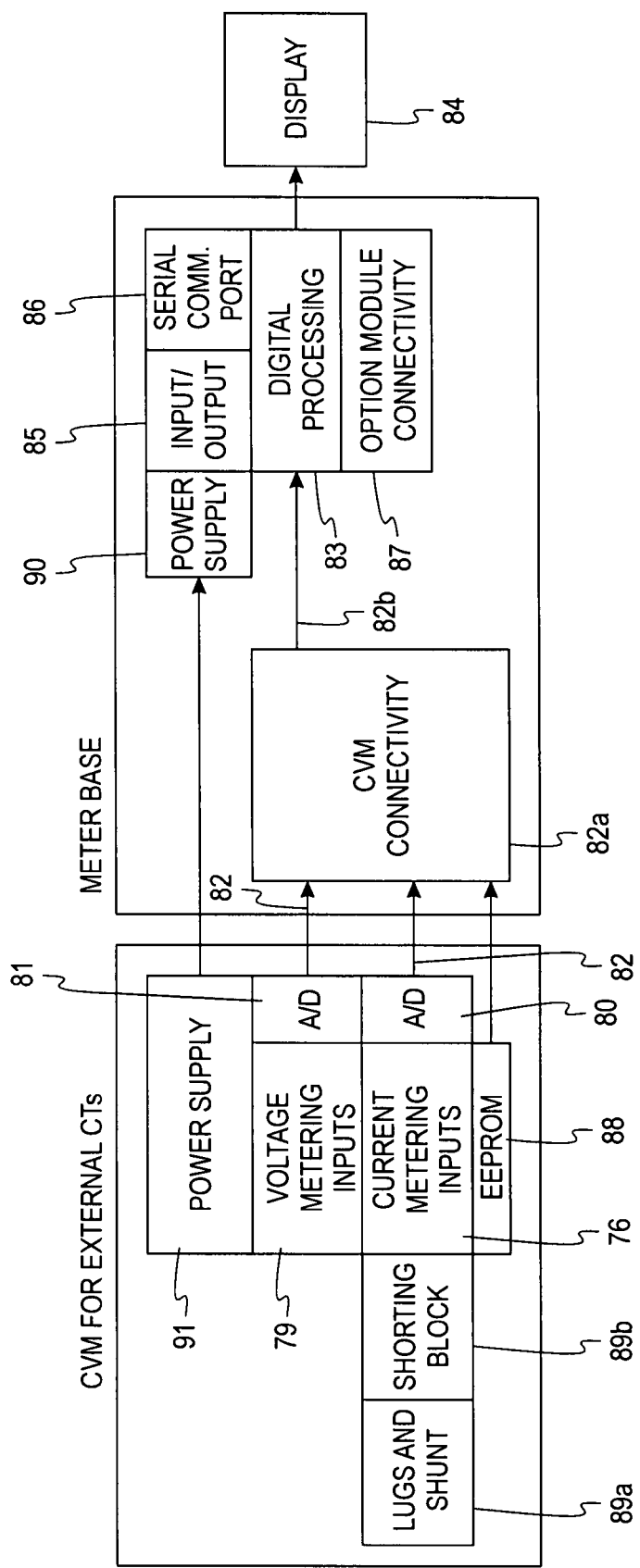
FIG. 14 is a block diagram of the internal architecture of a fourth embodiment of the current-voltage module of FIG. 10.

As depicted in FIGS. 13 and 14, the CVM of FIG. 10b may also be used with external current sensors such as current transformers in which the primary winding carries currents in the range of 1 to 5 amperes. The current output signals from the external current sensors are supplied to the first row of screw terminals on the top of the CVM housing 70. The top connections I1+, I2+, I3+ and I4+ correspond to one leg of the secondary of the CT. The bottom connections I1−, I2−, I3− and I4− correspond to the other leg of the secondary of the CT.

Internally, the current signals are received at current metering inputs 51 and fed to the A/D converter 80 for the current signals. The voltage signals are received at voltage metering inputs 53 and fed to the A/D converter 81 for the voltage signals via a conventional voltage divider to accommodate the input voltage levels. Shorting blocks 89*b* for the current transformers are provided within the CVM, so no external shorting blocks are required. Means are provided to replace the electronic components of the CVM while the current transformer circuits are shorted.

In reference to FIGS. 13, 14 and 10*b*, additional rows of screw terminals are provided at the top and bottom edges of the front surface 77 of the housing 70, for receiving four voltage lines 78*a*-78*d* connected to the four power conductors L1-L3 and N. The four upper terminals are part of four high-impedance terminals connected to an internal reference, for producing voltage signals at 79 inside the CVM housing 70. These voltage signals are proportional to the voltages between the respective power conductors L1-L3, N and the reference voltage of the DIN rail 4 (in most cases Ground), and are used to analyze the power being supplied to the load. Voltage dividers may be used to reduce the levels of the voltages being monitored. In other embodiments, the number of current and voltage signals that are produced could be reduced depending on the application and electrical system characteristics.

The CVM's of FIGS. 12 and 14 also furnish DC power for the meter base 1. In FIGS. 11 and 13, the meter base 1 contains a power supply circuit 90 that receives DC power from a source provided outside the power monitoring equipment. In FIGS. 12 and 14, however, the fact that the AC power distribution system is already connected to the CVM is utilized to provide the requisite DC power for the meter base 1 from within the power monitoring equipment, thereby eliminating the need for an external DC power source. For example, the AC power input, which might have a variety of different voltage levels within a range of 85 to 700 volts, is supplied to the internal power supply 91 that converts the high AC voltage to a DC output (e.g., 24 volts) for the power supply circuit 90 in the meter base. This DC output is supplied to the meter base circuit via line 92.

The CVM of FIGS. 10-14 can be made in different versions to provide different levels of accuracy for energy readings (e.g., 0.2%, 0.5%, etc.), different sample rates, and the like. For example, various degrees of precision resistors may be used in the voltage dividers of the voltage sensors in different modules to provide different levels of accuracy in the voltage sensor output signals. Similarly, different current transformers and/or shunts may be used in the current sensors in different modules to provide different sensor ranges and/or different levels of accuracy in the current sensor output signals. When the sensor range is changed, the gain channels of any downstream amplifiers are changed to match the changed sensor range. Different A/D converters may be used in different modules to provide different sampling rates, e.g., to increase the resolution of the signal conversion. CVM's may also be designed to meet higher-level protection classes such as CAT III, CAT IV, etc., by increasing the spacing of circuit-board tracings, increasing the isolation of current transformers, and increasing the thresholds of protection devices. Different CVM's may have different numbers of voltage and current channels, for monitoring different numbers of power distribution circuits. To provide increased immunity from events occurring in the power distribution system in applications having a high risk of such events, CVM's may be provided with over-current protection devices such as fuses, current-limiting transistors or even circuit breakers between the power conductors and the current sensors. Similarly, transient voltage surge suppression ("TVSS") devices may be provided between the power conductors and the voltage sensors. For applications where electromagnetic influences are a problem, CVM modules may be provided with radiation protection features such as filters, modified circuit board layouts, shielding and the like. Different modules may be provided for residential (FCC Class B) and industrial (FCC Class A) requirements.

Option Modules

As described above, the front of the meter base 1 is equipped with multiple connectors 10 for receiving mating connectors on option modules 11 which can be easily attached to, and detached from, the meter base 1. Each option module 11 can provide a different set of functions, or multiple modules that are identical to each other can be used. In the particular embodiment illustrated in FIGS. 3, 5 and 6, four modules 11*a*-11*d* of the same size are plugged into the connectors 12 on the front of the meter base 1.

FIG. 10*b* illustrates a single option module 100 that has the same width, e.g., 90 mm., as the meter base 1 to which the option module is attached. The option module 100 is a display unit that includes an LCD screen 101 for displaying the various outputs produced by the power monitoring system, which may include outputs from remote portions of the system that are networked with the meter base 1 via the communication bus 45. All the conventional circuitry, including integrated circuits, for driving and controlling the display screen are contained within the display module 101, receiving input signals via the standard connector 12 in the front wall of the meter base 1 and the mating connector in the rear wall of the module 100. All the necessary connections between the display module 101 and the meter base 100 are made by simply plugging the display module into the meter base.

Other examples of option modules for the modular power monitoring system are:

1. Modules that provide different levels of accuracy for energy readings as required (e.g., 0.2%, 0.5%, etc.).
2. Modules that provide different input voltage, current, frequency and/or temperature ranges and precisions.
3. Modules that provide additional ride-through capabilities.
4. Modules that provide different control power input ranges or types (e.g., AC, DC, etc.).
5. Modules that provide power line carrier communication capabilities.
6. Modules that provide wireless communications (either between sensor and meter or between meter and external system).
7. Modules that allow universal metering for water, air, gas, electricity, steam ("WAGES").
8. Modules that provide a co-processor for additional computing capabilities.
9. Modules that provide a different sample rate.
10. Modules that provide security limitations.
11. Modules that provide different input channels (e.g., allows for various system types, number of voltage/current inputs, etc.).
12. Modules that provide different protection classes as required (e.g., CAT III, CAT IV, etc.).
13. Modules that provide integrated surge protection.
14. Modules that provide different levels of emissions immunity.
15. Modules that provide different input impedance levels.

Figure 15:
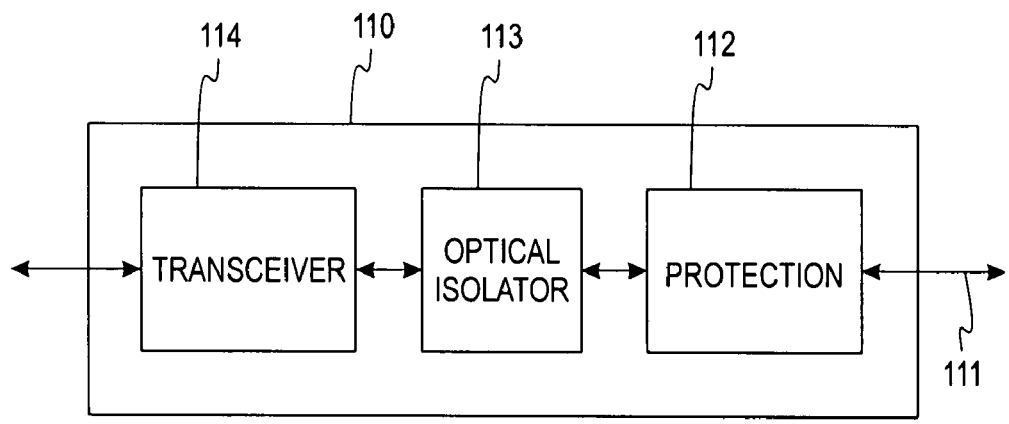
FIG. 15 is a block diagram of the internal architecture of a communication option module for providing different levels of immunity and/or surge protection for the power monitoring system.

FIG. 15 is an example of a module 110 for providing different levels of immunity from events occurring in the power distribution system. This module 110 receives signals, such as output signals from sensors coupled to the power distribution system, at an input 111 leading into a protection device 112 such as a metal-oxide varistor ("MOV"). The MOV protects the module from power line transients by shorting to ground when presented with a voltage above its rated "clamping voltage," so that surge current does not reach the downstream components in the module. Normal signals pass the MOV and are fed to an optical isolator 113 that converts the electrical signals to optical signals. An optical isolator uses a short optical transmission path to transfer a signal between elements of a circuit while keeping those elements electrically isolated. Since the signal goes from an electrical signal to an optical signal, and then back to an electrical signal, electrical contact along the path is broken. A common implementation of an optical isolator uses an LED and a light sensor, separated by a transparent electrical barrier so that light may travel across the barrier but electrical current may not. When an electrical signal is applied to the input of the optical isolator 113, light emitted by the LED is detected by a photodetector (e.g., a phototransistor) that produces a corresponding electrical signal that is directly proportional to the intensity of the detected light. The optical isolator thus allows for DC coupling while preventing excessive overvoltage conditions in one circuit from affecting the other.

The electrical output of the isolation device 113 is fed to a transceiver 114, which is a combination transmitter/receiver that allows the transmitter and receiver to be connected to the same antenna, and prevents the transmitter output from damaging the receiver. Transmission and reception may use the same frequency in a "half-duplex" mode of operation, or different frequencies in a "full duplex" mode that allows simultaneous transmission and reception. The output of the transceiver 114 may be sent to the meter base 1 through the plug-in connector 12, or to remote equipment via an antenna or a communication bus 45.

The module of FIG. 15 can be made in different versions to provide different levels of immunity by simply using protection devices 112 and/or optical isolators 113 having different characteristics to vary the level of immunity provided. For example, a MOV may be designed, or purchased, with different rated clamping voltages so that transients are shorted to ground at different threshold levels. Similarly, optical isolators may also be designed, or purchased, with different thresholds for overvoltage protection.

Figure 16:
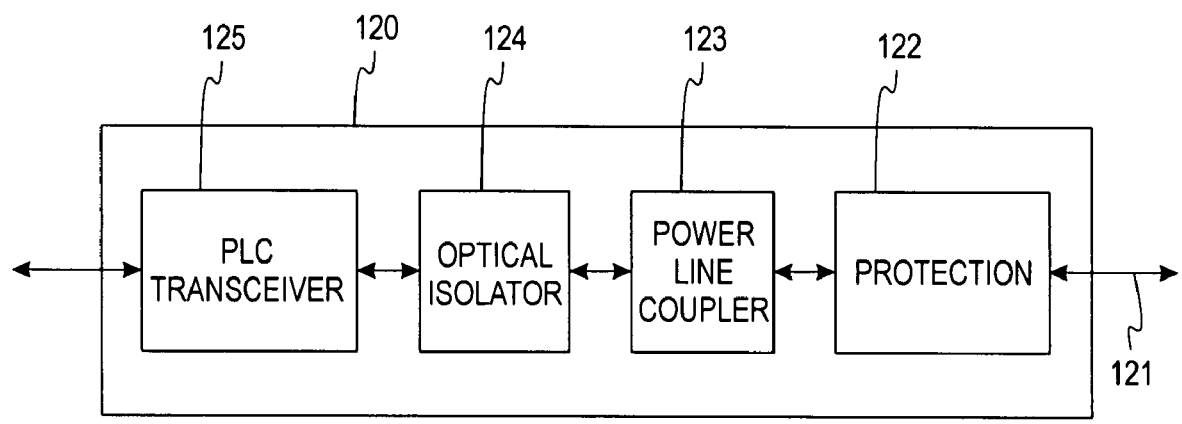
FIG. 16 is a block diagram of the internal architecture of an option module for providing power line carrier capabilities to the power monitoring system.

FIG. 16 is an example of a module 120 for providing power line carrier capabilities in a serial communications subsystem. This module 120 receives digital communication signals via a communication line 121 leading into a protection device 122, described above. From the protection device 122, the communication signal is passed to a power line carrier ("PLC") communication circuit 123 that conditions the signal for a power line communication system. The output of the PLC is fed to the optical isolation device 124, described above, and then to a PLC transceiver 125, which is a transceiver designed specifically for use in power line communication systems.

Figure 17:
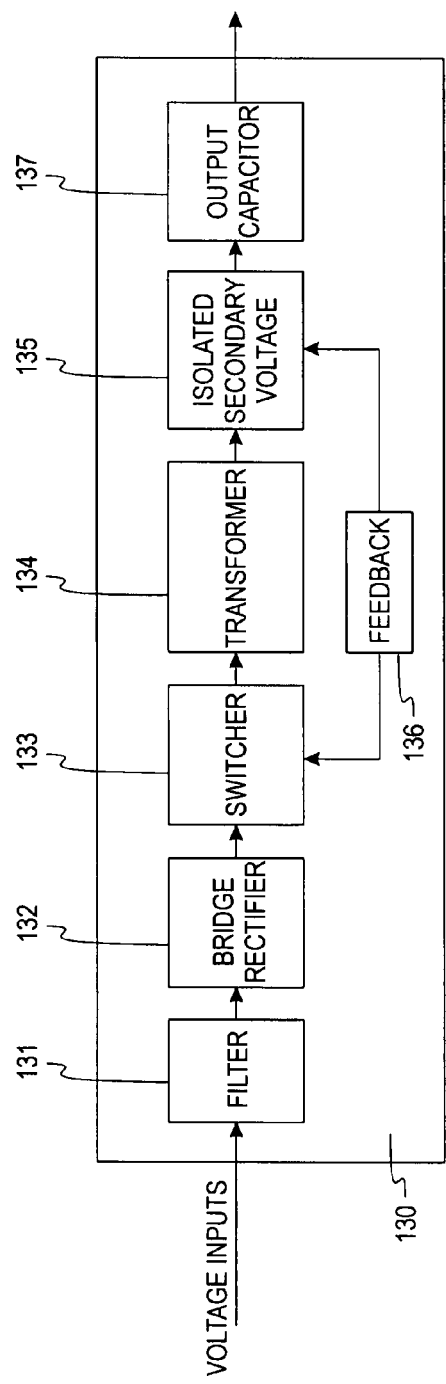
FIG. 17 is a block diagram of the internal architecture of an option module for providing different control power input rages or types for the power monitoring system.

FIG. 17 is an example of a module 130 for providing different control power input ranges or types (e.g., AC, DC, etc.). This module 130 receives an AC input voltage that is passed through a filter 131 and then a diode bridge rectifier 132 to convert the AC input to a pulsating DC waveform that is supplied to a switching regulator 133. The switching regulator converts the pulsating DC input to a smooth DC (e.g., 24 volts) output for powering the processor and control circuitry in the meter base 1. The output of the switching regulator passes through the primary winging of a transformer 134 which stores and releases energy during the on and off times of the regulator. The released energy passes through the secondary winding 135 of the transformer, which in turn is connected to an output capacitor 136 that filters noise frequencies produced by the switching regulator. The capacitor 136 can also store energy for use during a short power interruption.

The module of FIG. 17 may also be used to provide enhanced "ride-through" capabilities, i.e., to sustain a power output from the module in the event of a power interruption or voltage sag. In the illustrative embodiment, the ride-through capabilities are provided by the output capacitor 137, but a standby battery could also be used to provide ride-through.

Figure 18:
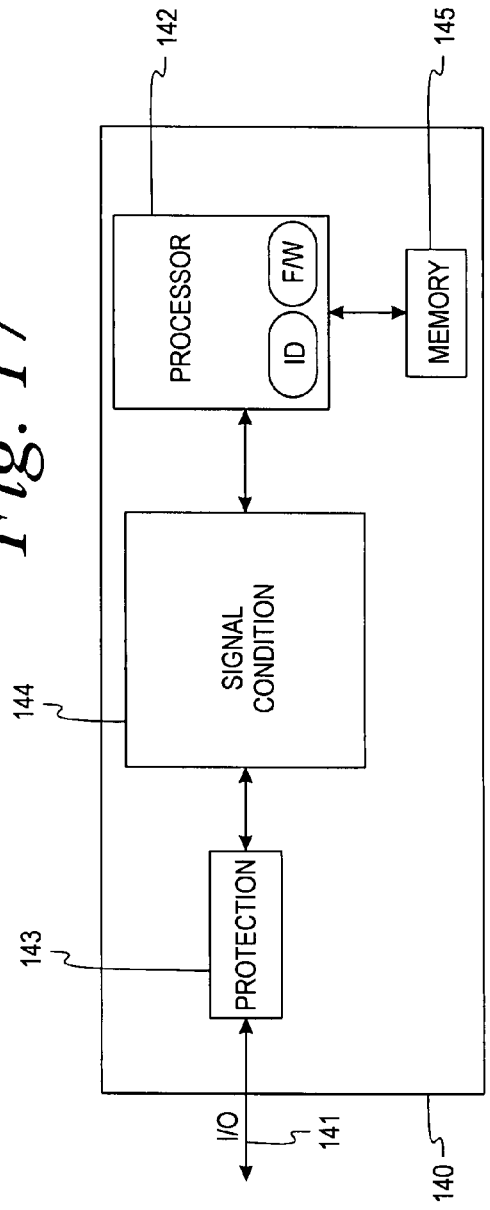
FIG. 18 is a block diagram of the internal architecture of an option module for providing universal metering capabilities for the power monitoring system.

FIG. 18 is an example of a module 140 for allowing universal metering, sometimes referred to as "WAGES" (water, air, gas, electricity and steam). This module 140 has an I/O port 141 which handles both input and output signals. The input signals may include current and/or voltage signals to be utilized in a processor 142, and the output signals may include those generated by the processor 142. Multiple digital and/or analog input and output signals may be handled by this module. The I/O port 141 is coupled to a bidirectional protection device 143 of the type described above. Between the protection device 143 and the processor 142, both incoming and outgoing signals are passed through signal conditioning circuitry 144 capable of handing both digital and analog inputs and outputs. A memory device 145 connected to the processor 142 stores firmware, logging data, alarm thresholds and other configuration data.

Figure 19:
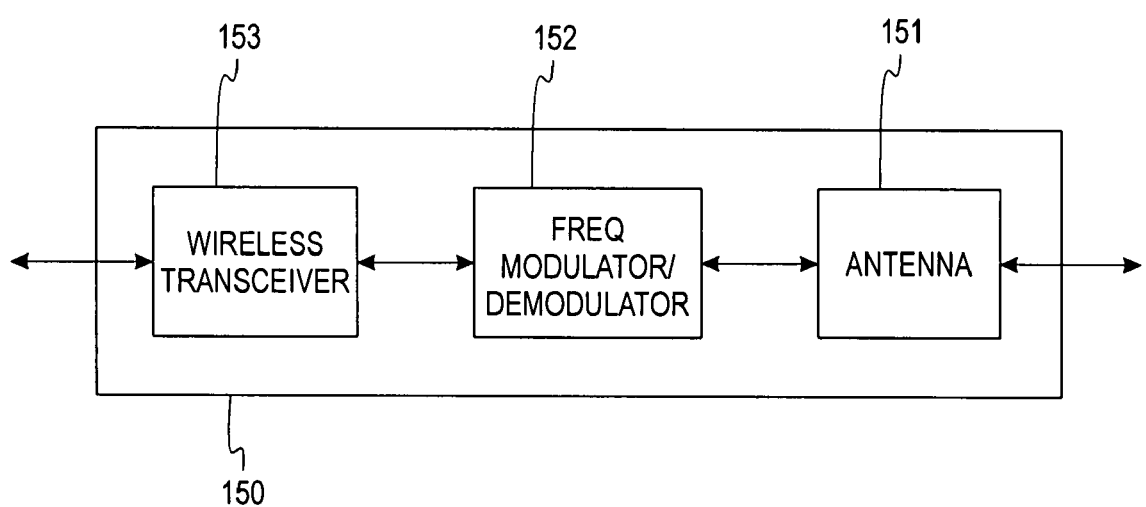
FIG. 19 is a block diagram of the internal architecture of an option module for providing the power monitoring system with wireless communication capabilities.

FIG. 19 is an example of a module 150 that enables the use of wireless communications with a meter base. Incoming wireless signals are received by an antenna 151 and fed to a frequency modulator/demodulator 152 that demodulates incoming frequency-modulated signals. A wireless transceiver 153 receives the demodulated signals and feeds them to the meter base. The process is reversed for outgoing signals received by the transceiver 153 from the meter base.

Turning now to the drawings and referring first to FIG. 20, a set of four identical CVM's 210, 211, 212 and 213 are coupled to the four insulated conductors L1, L2, L3 and N of a three-phase power distribution system. Each CVM 210-213 is clamped tightly around the insulation of one of the power conductors L1-L3 and N so that any current flowing in that conductor is sensed by the CVM, which produces a corresponding current signal for use in a power monitoring system. In addition, each CVM also includes a voltage sensor that produces a corresponding voltage signal for use in the power monitoring system.

The analog output signals from both the current sensors and the voltage sensors in the CVM are converted to a digital signal in analog-to-digital ("A/D") converters built into the CVM's 210-213. The resulting digital output signals from the A/D converters can be fed to a processor that executes a series of calculations designed to monitor multiple characteristics of the power being distributed via the conductors L1-L3 and N. The CVM also contains built-in signal conditioning circuitry, between the sensors and the A/D converters, to condition the sensor output signals for presentation to the A/D converters.

When more than one CVM is used, as in the application illustrated in FIG. 20, the digital outputs of the multiple CVM's may be connected to a sensor base module containing a power supply or daisy-chained so that those outputs are communicated to the downstream processor serially in a single communication channel. In the illustrative embodiment of FIG. 20, the four CVM's 210-213 are daisy chained by four cable segments 214-217, with the final segment 217 being coupled to the downstream processor, or to a module containing that processor.

As will become apparent from the following description, the illustrated CVM's offer a number of advantages over CVM's that have been previously used or proposed, including ease and flexibility of installation, a reduced footprint, minimal wiring requirements, and a reduced number of parts.

Figure 22:
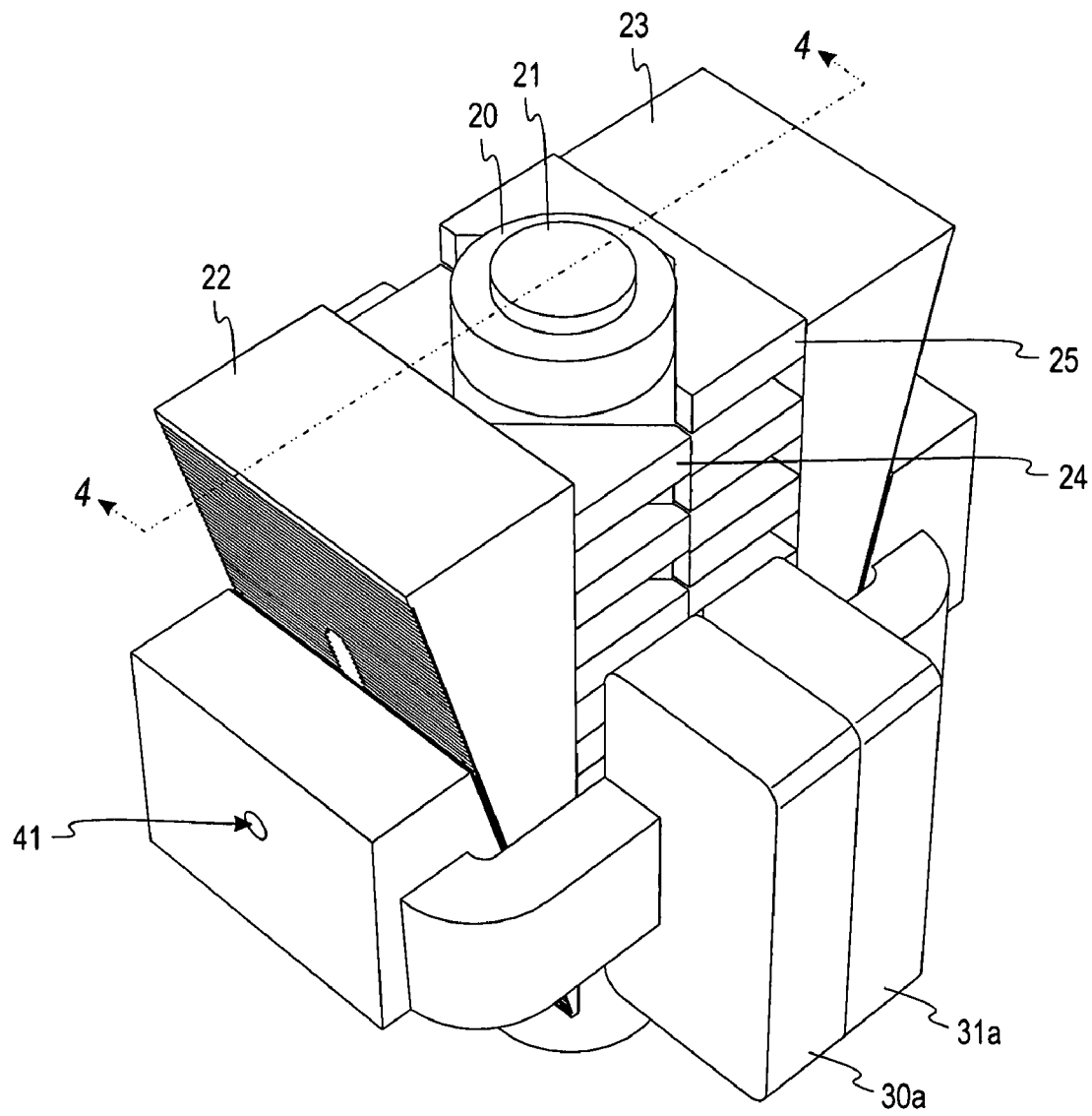
FIG. 22 is a further enlarged perspective view of one of the clamp-on current and voltage modules shown in FIG. 20.
Figure 23:
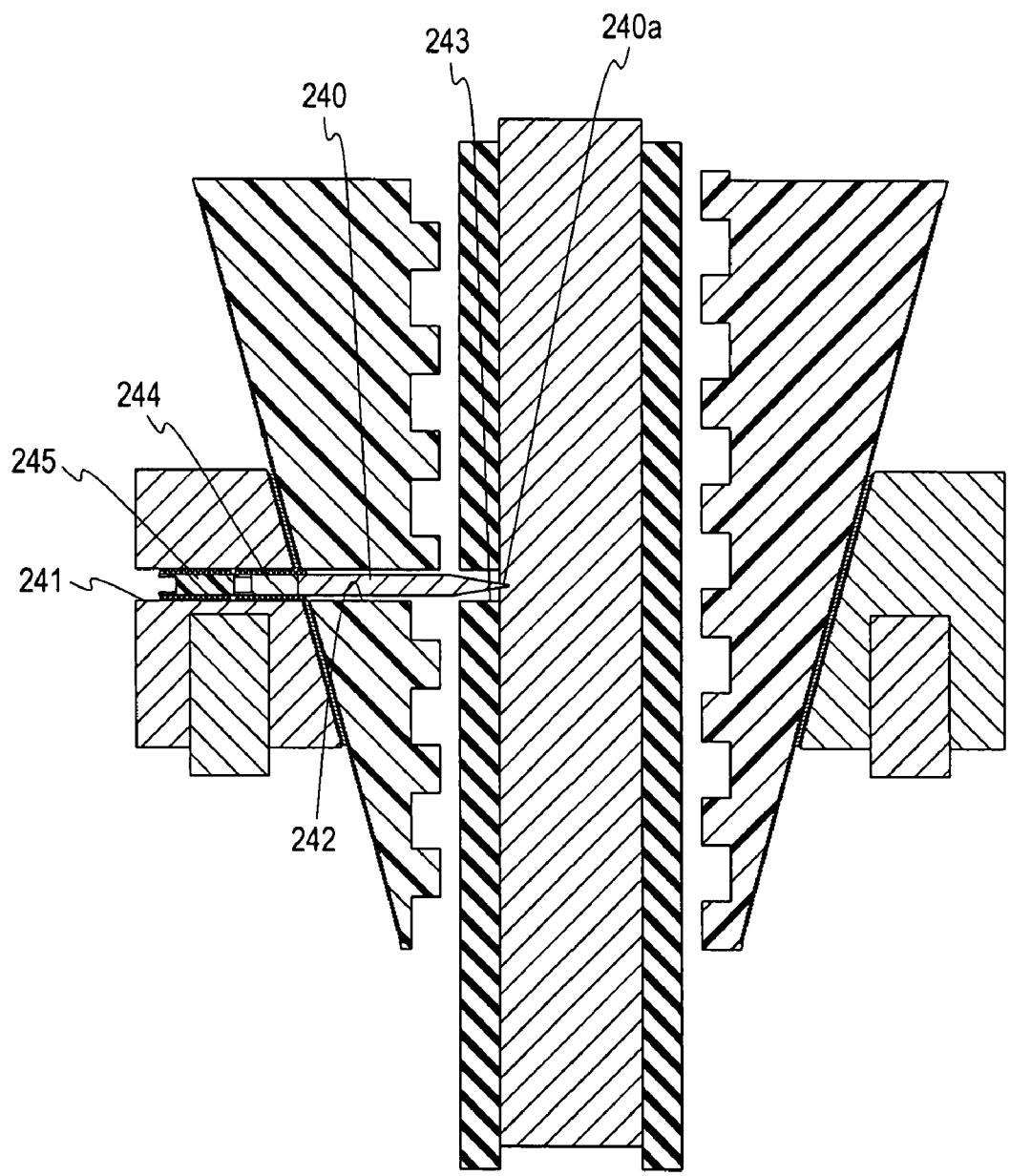
FIG. 23 is a section taken along line 4-4 in FIG. 22.

The various components of each of the CVM's shown in FIG. 20 can be seen more clearly in FIGS. 21-23. The insulation 220 surrounding a conductor 221 is gripped on opposite sides by a pair of clamping elements 222 and 223 that form interdigital sets of spaced ribs 224 and 225, respectively, on their opposed inner surfaces. All the interdigital ribs 224 and 225 are notched to form a pair of opposed, generally V-shaped channels 226 and 227 extending parallel to the longitudinal axis of the conductor 221. When the two clamping elements 222 and 223 are pressed against opposite sides of the insulation 220, the outer portions of the interdigital ribs 224 and 225 slide between each other so that the narrow surfaces of the inner portions of the ribs 224 and 225 bite into the insulation. After the two sets of ribs have been pressed firmly against the insulation, there can be no relative movement between the insulated conductor and the two clamping elements as long as the clamping elements continue to be pressed firmly against opposite sides of the insulated conductor.

The V shape of the channels 226 and 227 enables the clamping elements 222 and 223 to accommodate a wide range of different diameters of insulated conductors. Specifically, the minimum diameter that can be accommodated by the clamping elements 222 and 223 can accommodate is a diameter equal to the smallest transverse dimension of the hexagonal opening 228 formed when the two sets of ribs 224 and 225 fully overlap each other, as depicted in FIG. 21b.

The opposed clamping elements 222 and 223 are pressed against opposite sides of the insulated conductor by two mating C-shaped members 230 and 231 having respective pads 230a,b and 231a,b at their open ends. Each C-shaped member forms half of the core 232 of a current transformer, so that when the two mating pairs of pads 230a, 231a and 230b, 231b are pressed against each other, a 360° core 232 surrounds the insulated conductor. The two clamping members are held together by two captive screws, one on each pad.

It will be noted that the two C-shaped members 230 and 231 have a fixed size, although the space between the two clamping elements 222 and 223 can vary to accommodate different diameters of insulated conductors. The fixed size of the members 230 and 31 is accommodated by providing an angled interface between each of the members 230 and 31 and the opposed clamping element 222 or 223, as can be seen most clearly in FIG. 23. The C-shaped member 230 forms an angled inner surface 232 that engages a similarly angled, but longer, surface 222a on the clamping element 222. Similarly, the C-shaped member 231 forms an angled inner surface 233 that engages a similarly angled, but longer, surface 223a on the clamping element 223. It will be noted that as the radial spacing between the two clamping elements 222 and 223 is varied, the surfaces 222a and 223a can remain engaged with the opposed surfaces 232 and 233 of the C-shaped members by simply adjusting the relative longitudinal positions of the members 230 and 231 with respect to the clamping elements 222 and 223. Thus, regardless of the radial spacing between the clamping elements 222 and 223, the pads of the members 230 and 231 can tightly engage each other, and at the same time the interface surfaces 222a, 232 and 223a, 233 can also tightly engage each other.

When electrical current is flowing in the power conductor 221, current flow is induced in a winding of the current transformer, as is well known in this industry. The current flow in the transformer winding is used as the current signal that is processed and ultimately fed to a processor in the power monitoring system.

A voltage signal is also produced, by engaging the power conductor 221 with a conductive radial probe 240 (see FIGS. 21 and 23). The probe 240 is passed through registered holes 241, 242 and 243 formed in the C-shaped member 230, the adjacent clamping element 222, and the insulation on the conductor 221. A sharp point 240a on the end of the probe 240 enable the probe to slightly penetrate the metal of the conductor 221 to ensure good electrical contact. The probe 240 is forced against the conductor 221 by a metal screw 44 threaded into the outermost hole 241 (formed in the C-shaped member 230), which is followed by a non-conductive screw 245 made of plastic, ceramic or the like so that the voltage on the probe 240 and metal screw 244 is not exposed on the exterior of the CVM.

Figure 24:
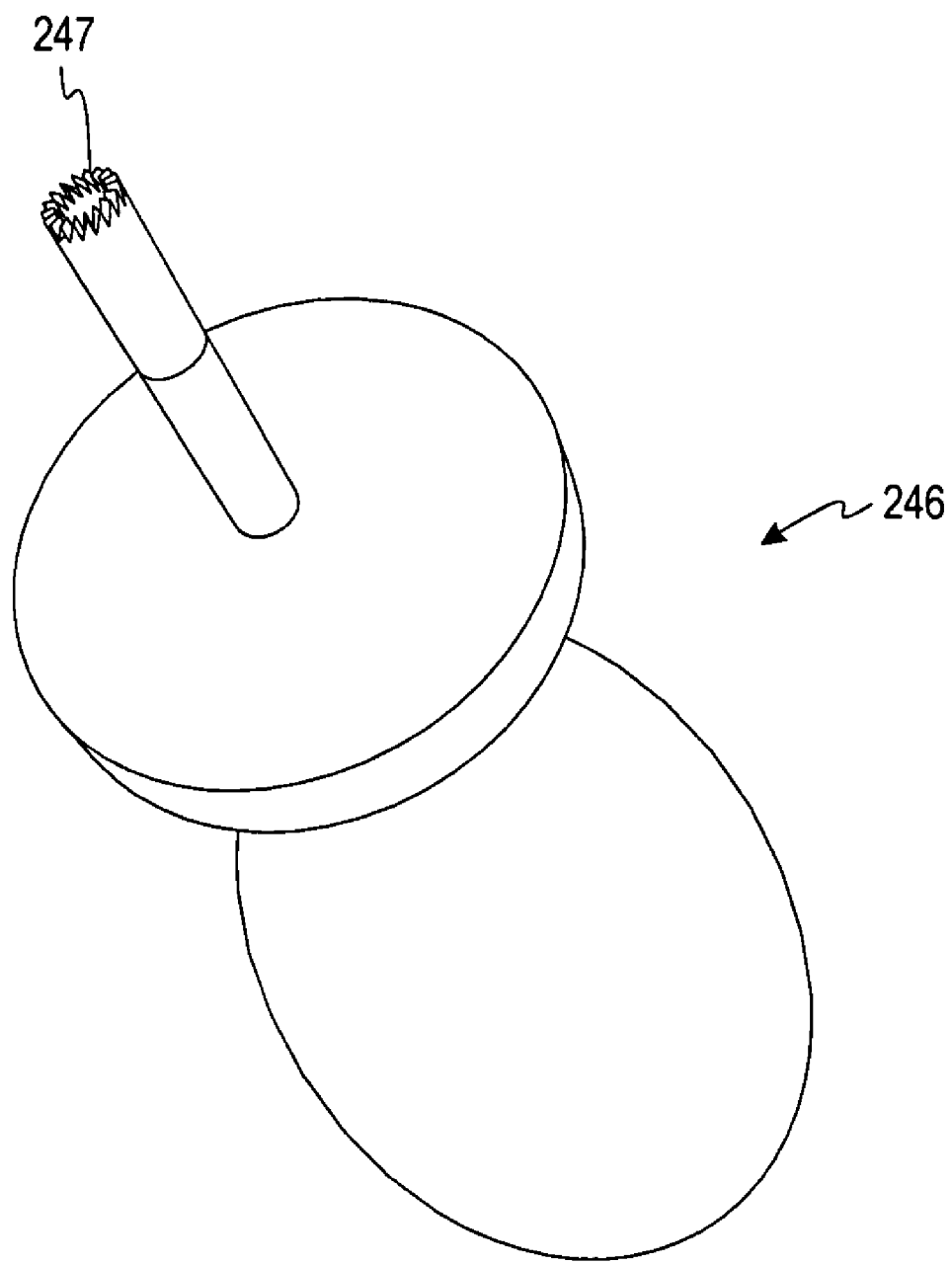
FIG. 24 is a further enlarged perspective view of the tool shown in FIG. 2.

FIG. 24 illustrates a tool 246 for use in forming the hole 243 in the insulator on the power conductor 221. The tool 246 is inserted through the registered holes 241 and 242 to engage the insulator, and then rotated so that serrated teeth 247 on the end of the tool cut through the insulation.

Figure 25:
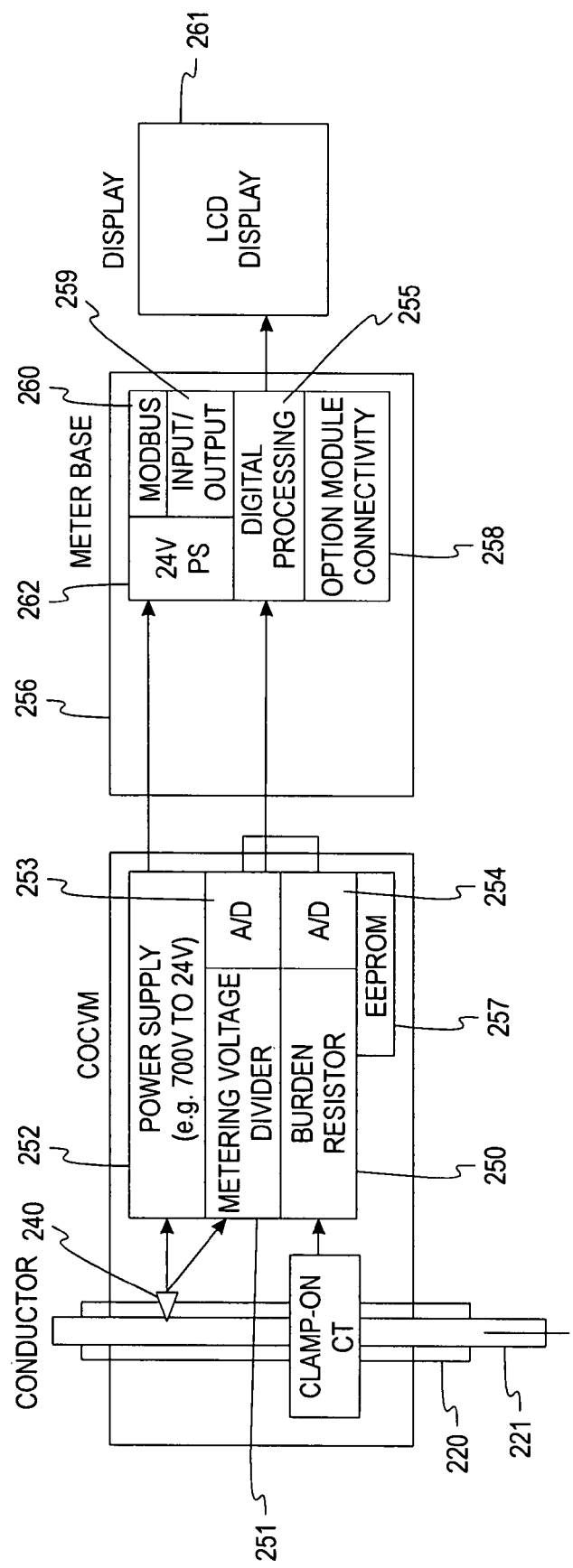
FIG. 25 is a block diagram of the internal architecture of one particular embodiment of the current and voltage modules shown in FIGS. 20-23.

FIG. 25 illustrates the circuitry contained within the CVM. This circuitry is provided by one or more small printed circuit ("PC") boards mounted inside one or both of the C-shaped members 230 and 231 that contain the core of the current transformer. Specifically, the PC board(s) may be embedded in one or more of the pads 230a,b and 231a,b formed by the members 230 and 231, or in one or both of the central portions of those members that form the angled surfaces 232 and 233. As shown in FIG. 25, the built-in circuitry includes a burden resistor 250 for the current transformer, a metering voltage divider 251 for the voltage signal from the voltage sensing probe 40, a power supply 252 that converts the AC line voltage to a 24-volt DC supply for the power monitoring system, and a pair of analog-to-digital ("A/D") converters 253 and 254 that convert the analog current and voltage signals to digital signals that can be fed to a downstream processor 255 in a meter base 256. The CVM also contains a memory device, such as the EEPROM 257 depicted in FIG. 25, for storing data identifying the CVM and its electrical characteristics. The circuitry may optionally include signal conditioning circuits.

The meter base 256 contains the processor 255 that receives the current and voltage signals from the CVM via serial bus 257 and generates the outputs required for desired displays, reports and remote communications. The processor 255 may also receive input signals from option modules via connecting circuitry 258, and may receive and transmit communication signals via an I/O port 259 coupled to a standard communication bus such as a MODBUS 260 for communicating with remote equipment, such as work stations networked with the power monitoring equipment. The processor 255 produces output signals representing data to be displayed on a display module 261. A DC power supply 262 receives low voltage DC power (e.g. 24-volt DC) from the power supply in the CVM or from an external source and generates the different voltage levels needed for the processor and other meter base components.

With the illustrative CVM, no shorting blocks or fuses need be employed. The CVM can be used with power conductors carrying currents in the range of 100 to 630 amperes, and voltages ranging up to 770 volts.

The CVM of FIGS. 20-25 can be used in the initial installation of power monitoring systems or to retrofit previously installed systems. The CVM integrates multiple components into single units to facilitate installation and reduce the number of parts to be handled and installed. Multiple CVM's can be easily daisy chained for multi-phase applications. The CVM significantly reduces the size of the overall monitoring system, the number of connections required, and the complexity of the installation. A single connector can be employed to furnish all the input signals required by the power monitoring system, as well as control power for the system. The CVM is a double-isolated device with low voltage output which makes it a self-contained, safe solution for sensing both current and voltage. The CVM also provides a reduced footprint, reduced installation time, reduced wiring errors, improved flexibility of installation, increased simplicity of installation, improved safety, improved total system accuracy, and reduction of total solution cost versus alternative solutions.

Figure 26:
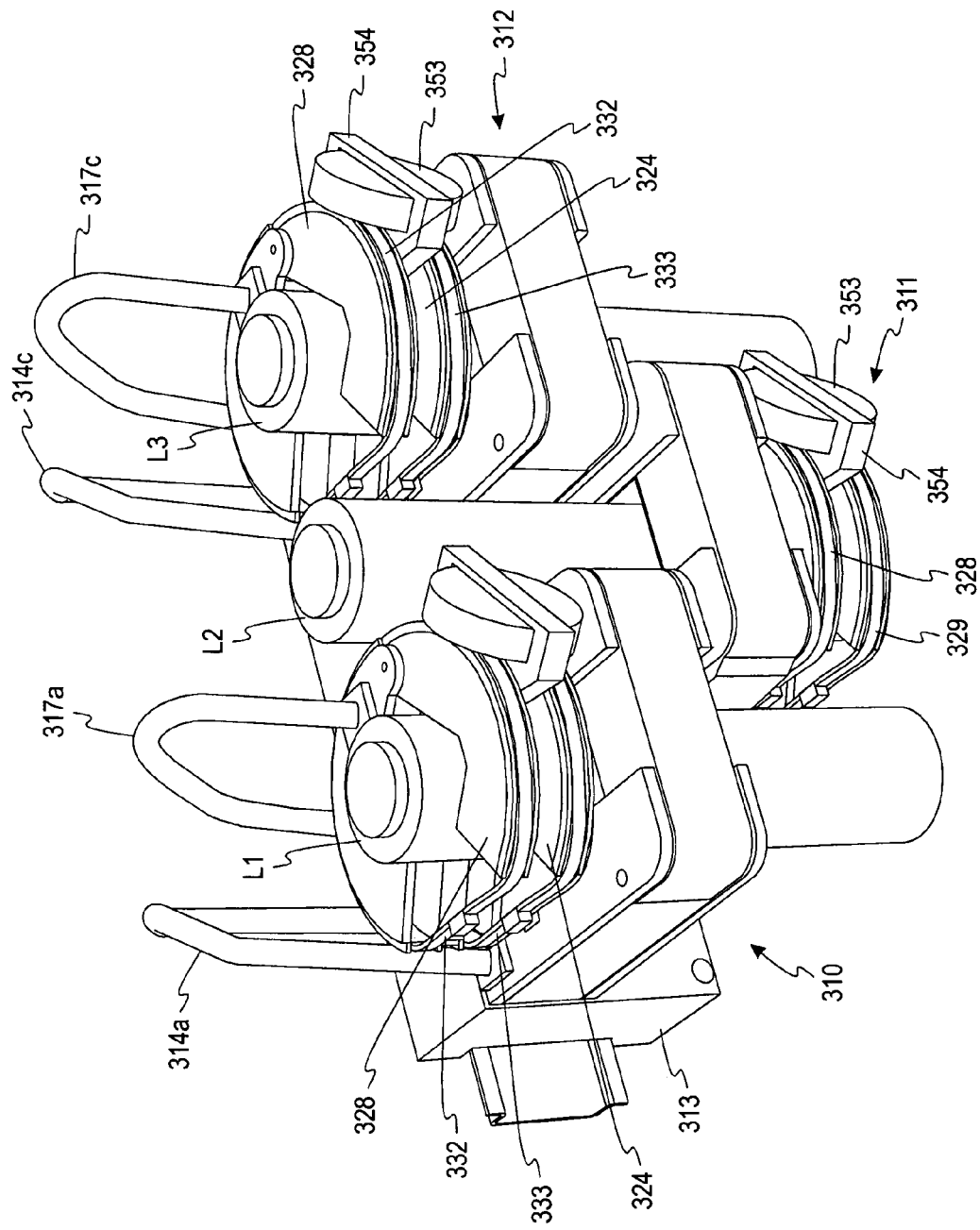
FIG. 26 is a perspective view of a set of three clamp-on current and voltage modules installed on the three conductors of a three-phase power distribution system.

A modified embodiment of a CVM is illustrated in FIGS. 26-33. In FIG. 26, a set of three identical CVM's 310, 311 and 312 are coupled to the three insulated conductors L1, L2 and L3 of a three-phase power distribution system. Each CVM 310-312 is clamped tightly around the insulation of one of the power conductors L1-L3 so that any current flowing in that conductor is sensed by the CVM, which produces a corresponding current signal for use in a power monitoring system. In addition, each CVM also includes a voltage sensor that produces a corresponding voltage signal for use in the power monitoring system.

The analog output signals from both the current sensors and the voltage sensors in the CVM are converted to a digital signal in analog-to-digital ("A/D") converters built into the CVM's 310-312. The resulting digital output signals from the A/D converters can be fed to a processor that executes a series of calculations designed to monitor multiple characteristics of the power being distributed via the conductors L1-L3. The CVM also contains built-in signal conditioning circuitry, between the sensors and the A/D converters, to condition the sensor output signals for presentation to the A/D converters.

When more than one CVM is used, as in the application illustrated in FIG. 26, the digital outputs of the multiple CVM's may be connected to a sensor base module 313 (power supply) or daisy-chained so that those outputs are communicated to the downstream processor serially in a single communication channel. In the illustrative embodiment of FIG. 26, the three CVM's 310-312 are daisy chained by six cable segments, three segments 314a-c for the current channels and three segments 317a-317c for the voltage channels cable segments, with the final segment 317c being coupled to the downstream processor, or to a module containing that processor.

As will become apparent from the following description, the illustrated CVM's offer a number of advantages over CVM's that have been previously used or proposed, including ease and flexibility of installation, a reduced footprint, minimal wiring requirements, and a reduced number of parts.

Figure 27:
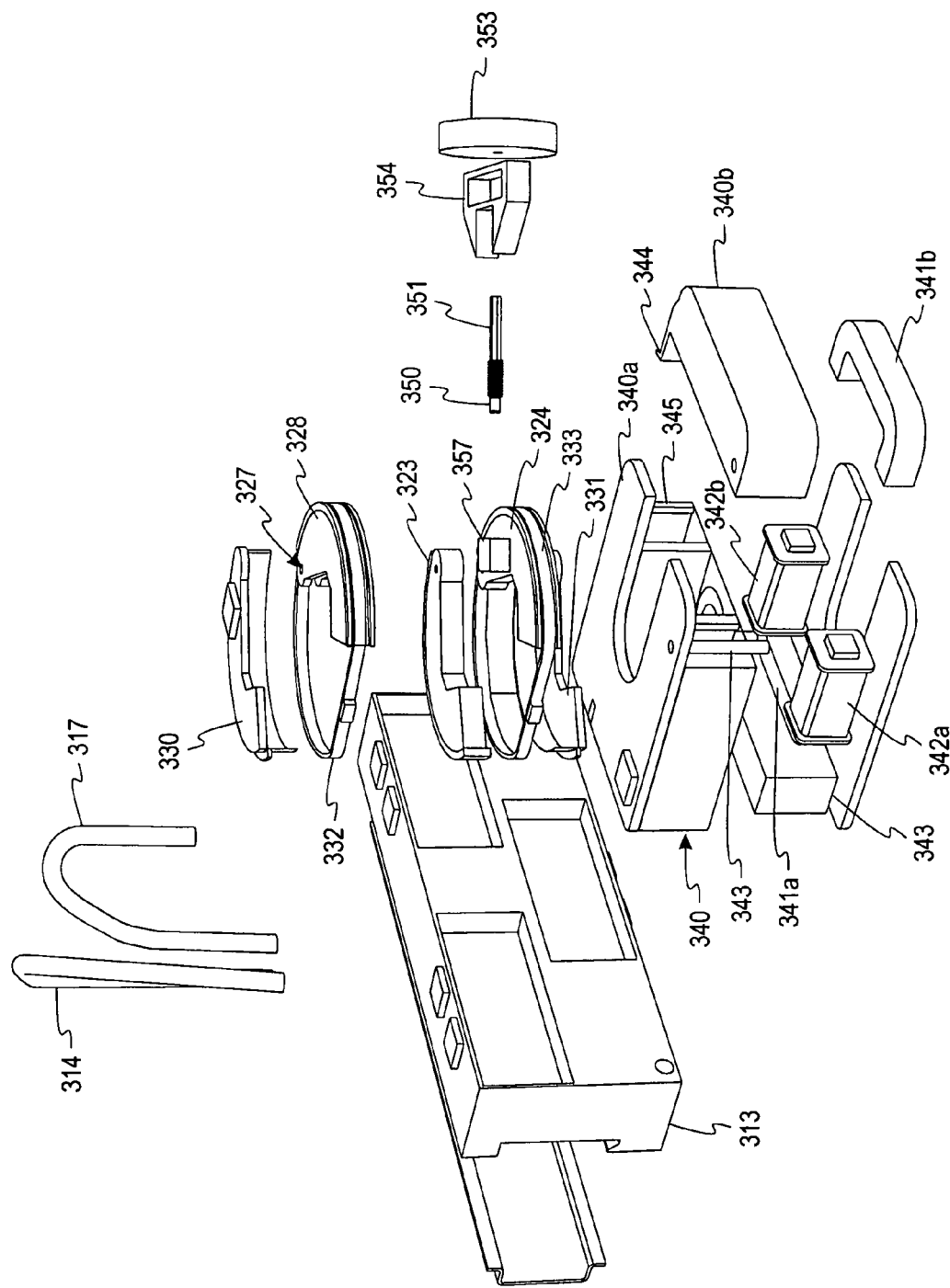
FIG. 27 is an enlarged, exploded perspective view of one of the clamp-on current and voltage modules shown in FIG. 26.
Figure 28:
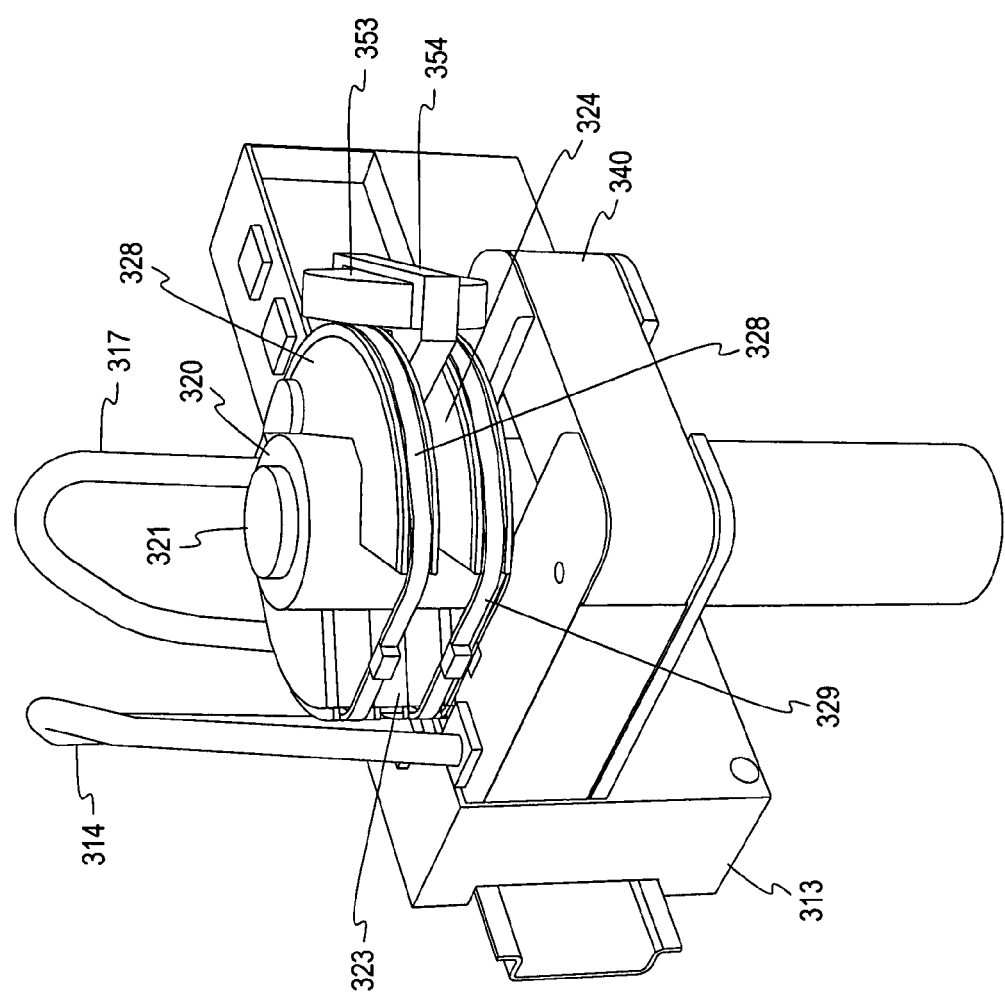
FIG. 28 is a further enlarged perspective view of one of the clamp-on current and voltage modules shown in FIG. 26 with the power supply module.
Figure 30:
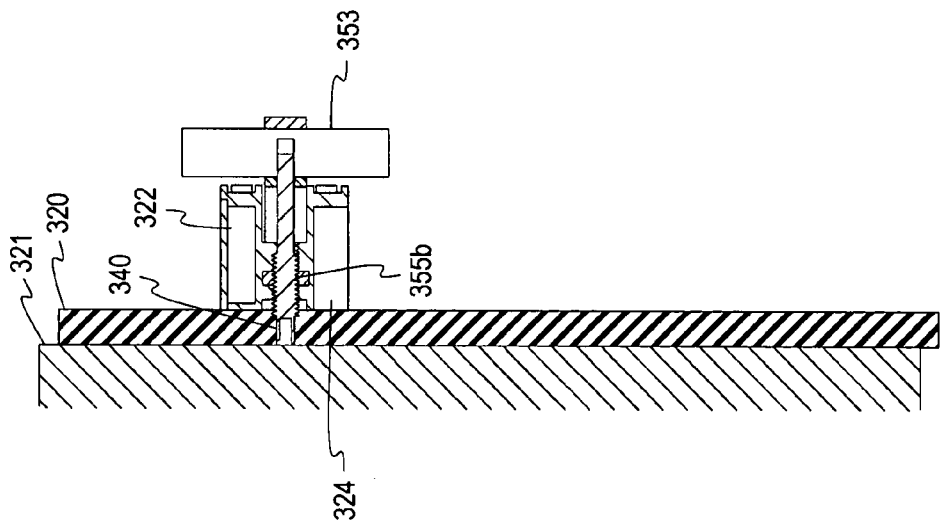
FIG. 30 is a section taken along line 11-11 in FIG. 29.
Figure 29:
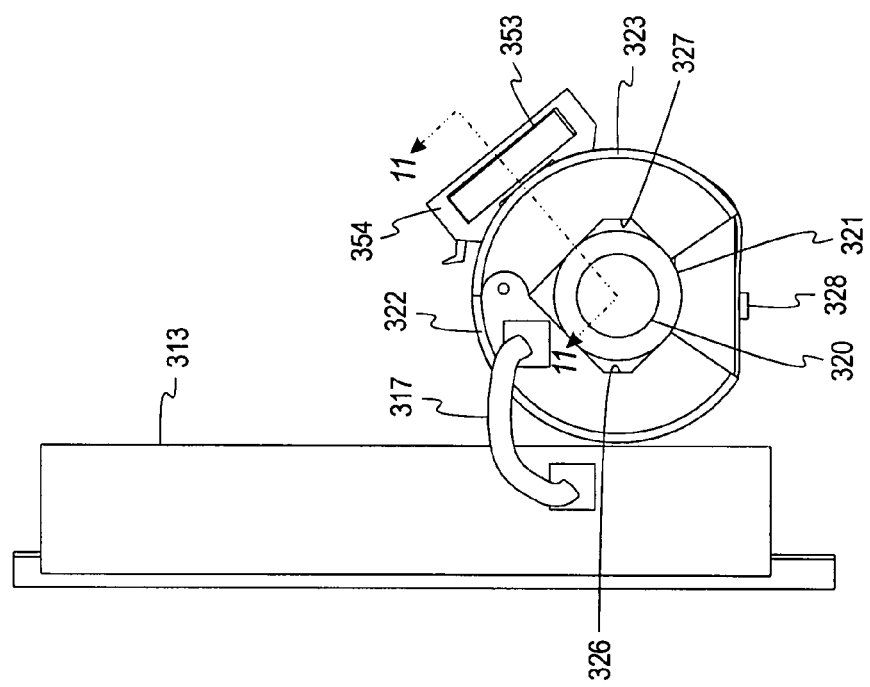
FIG. 29 is a top plan view of the modules shown in FIG. 28.

The various components of each of the CVM's shown in FIG. 26 can be seen more clearly in FIGS. 27-29. The insulation 320 surrounding a conductor 321 is gripped on opposite sides by a clamping assembly that includes clamping elements 322, 323 and 324 that form opposed notches on their opposed inner surfaces. When the clamping elements 322-324 are pressed against opposite sides of the insulation 320, the opposed inner edges of the clamping elements bite into the insulation. After the two sets of ribs have been pressed firmly against the insulation, there can be no relative movement between the insulated conductor and the clamping elements as long as the clamping elements continue to be pressed firmly against opposite sides of the insulated conductor.

Figure 32C:
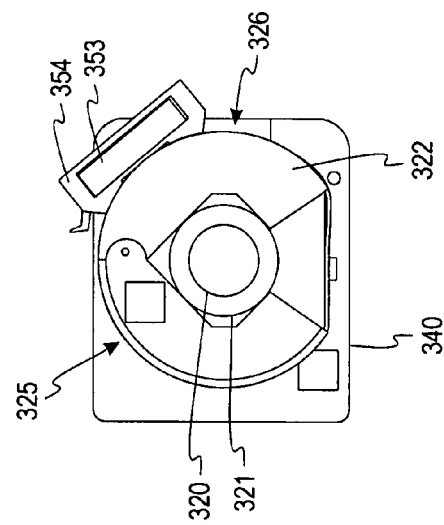
FIG. 32 is a top plan view of one clamp-on current and voltage module showing different degrees of openings (a-installation, b-minimum conductor diameter, c-maximum conductor diameter).
Figure 32B:
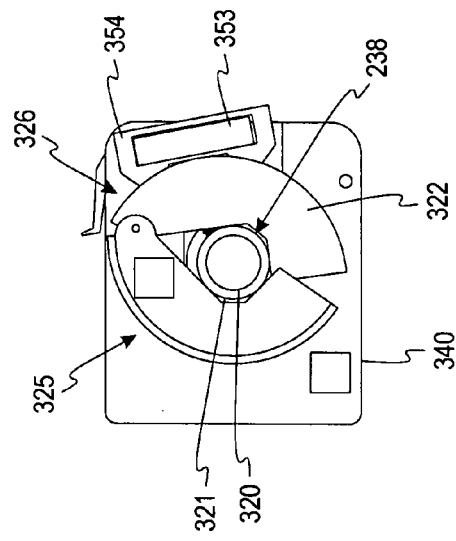
Figure 32A:
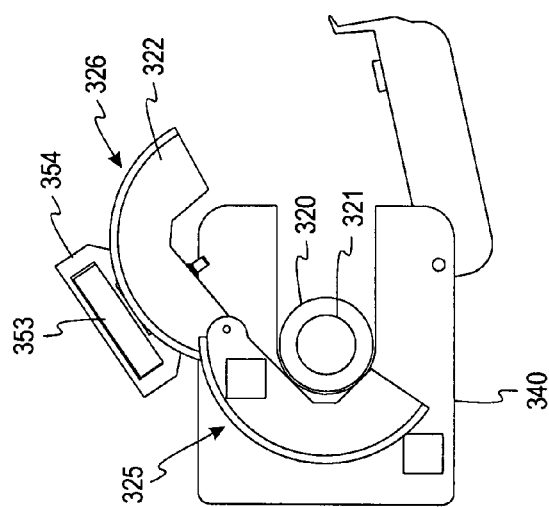
Figure 33:
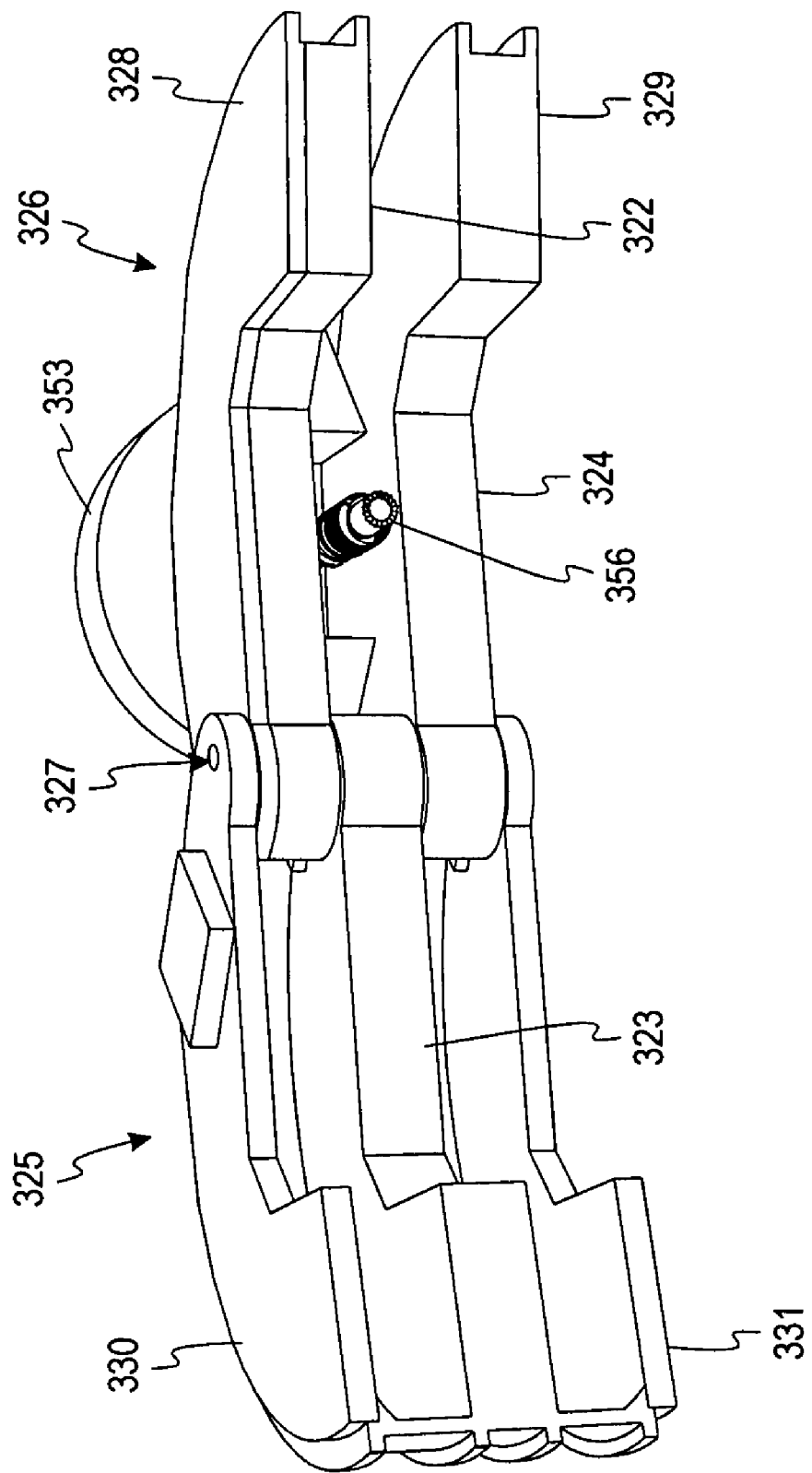
FIG. 33 is an enlarged perspective view of the clamping assembly and voltage probe in the CVM of FIGS. 26-32.

The individual components of the clamping assembly are shown in more detail in FIG. 33. Two clamping sub-assemblies 325 and 326 are mounted for pivoting movement about a common axis defined by a shaft 327. The right-hand sub-assembly 326, as viewed in FIG. 33, includes the two clamping elements 322 and 324, the outer surfaces of which are covered by caps 328 and 329. The left-hand sub-assembly 325, as viewed in FIG. 33, includes the third clamping element 323 and a pair of end plates 330 and 331. It can be seen that the clamping element 323 is positioned between the other two clamping elements 322 and 324 so that the left and right elements have an interdigital relationship that enables them to overlap each other as they are pivoted toward each other, around the shaft 327. As can be seen in FIGS. 32a-32c, the generally V-shaped notches formed by the inner surfaces of the clamping elements 322-324, combined with the pivoting movement and interdigital relationship of the clamping elements, enables the clamping assembly to accommodate a wide range of different diameters of insulated conductors. FIG. 32a shows two sub-assemblies 325 and 326 wide open with a medium-diameter power conductor 321 ready to be engaged, FIG. 32b shows the sub-assemblies slightly overlapping to engage a relatively small-diameter power conductor 321, and FIG. 32c shows the sub-assemblies in an intermediate position engaging a larger-diameter power conductor 321.

Clamping pressure is applied to the two sub-assemblies 325 and 326, and thus to the clamping elements 322-324, by a pair of wire ties 332 and 333 extending around both sub-assemblies. These wire ties 332 and 333 are applied after the sub-assemblies 325 and 326 have been pivoted into engagement with the power conductor, and are drawn tightly around the sub-assemblies to draw the clamping elements 322-324 into tight engagement with the insulation 320 of the power conductor. This captures the insulated conductor 320 firmly between the clamping elements.

In reference to FIG. 27, the current transformer for the CVM of FIGS. 26-32 is contained in a housing 340 that also supports the clamping assembly. The current transformer includes a core 341 formed by two C-shaped core sections 341a and 341b and having two windings 342a and 342b wound around opposite legs of the core. The windings 342a,b are electrically connected to circuitry on a PC board 343 in the rear of the housing 340. When electrical current is flowing in the power conductor 321, current flow is induced the windings 342a,b, which is the current signal that is processed and ultimately fed to a processor in the power monitoring system.

The housing 340 is formed of two sections 340a and 340b which are hinged together by a pin 343. A hook 344 on the free end of the section 340b snaps over an internal flange 345 on the section 340a when the section 340b is pivoted to its closed position.

A voltage signal is also produced, by engaging the power conductor 321 with a conductive probe 350 (see FIGS. 27 and 31). The probe 350 includes a hexagonal shank 351 that fits into a mating socket 352 in a thumb wheel 353 that fits into a mounting bracket 354. The shank 351 extends through a pair of holes 354a and 354b in the bracket 354 to hold the thumb wheel 353 in place. The bracket fits between the two clamping elements 322 and 324 and mates with a block 357 mounted on the surface of the clamping element 324. When the thumb wheel 353 is rotated, it rotates the probe 350 and thus engages threads 355 of the probe 350 with mating threads in a hole extending through the block 357. The threads 355 cause the probe 350 to be advanced into engagement with the insulation 321 on the power conductor 320. The inboard end 356 of the probe 350 forms multiple teeth that cut through the insulation 321 as the probe is rotated and that bite into the metal conductor 320 when the insulation has been penetrated.

The thumb wheel 353 is sufficiently thick to permit sufficient radial movement of the probe to penetrate the insulation 321 without escaping from the hexagonal socket 352 in the thumb wheel. This thumb wheel is preferably made of a non-conductive material, such as glass-reinforced plastic, ceramic or the like, so that the voltage on the probe 340 is not exposed on the exterior of the CVM. The voltage signal is carried from the sensor to voltage-conditioning circuitry on the PC board 343 through a conductive thread (or nut) (355b of FIG. 30) and a wire inserted in the non-conductive CT enclosure.

The circuitry contained within the CVM of FIGS. 26-34 is the same as that described above in connection with FIG. 25. The CVM provided can be used in the initial installation of power monitoring systems or to retrofit previously installed systems. The CVM integrates multiple components into single units to facilitate installation and reduce the number of parts to be handled and installed. Multiple CVM's can be easily daisy chained for multi-phase applications. The CVM significantly reduces the size of the overall monitoring system, the number of connections required, and the complexity of the installation. A single connector can be employed to furnish all the input signals required by the power monitoring system, as well as control power for the system. The CVM is a double-isolated device with low voltage output which makes it a self-contained, safe solution for sensing both current and voltage. The CVM also provides a reduced footprint, reduced installation time, improved flexibility of installation, increased simplicity of installation, improved safety, improved total system accuracy, and reduction of total solution cost versus alternative solutions.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

The invention claimed is:

1. A power monitoring system for monitoring characteristics of power transmitted through one or more power lines, said power monitoring system comprising
    a meter base including
        a processor and associated circuitry for processing signals derived from sensors coupled to said power lines and producing output signals representing selected characteristics of said power transmitted through said power lines, and
        a housing containing said processor and said associated circuitry and having a first surface adapted to be mounted on a support, and a second surface containing multiple connectors for receiving multiple modules and electrically connecting said modules to said processor and said associated circuitry, and
    multiple option modules each of which includes
        a housing having a first surface containing a connector that is complementary with said multiple connectors in said second surface of said meter base so that any of said option modules can be plugged into any of said multiple connectors in said second surface of said meter base, and
        circuitry within said housing of each option module for interconnecting with said processor and said associated circuitry in said meter base,
    wherein said option modules include a display module for receiving said output signals and displaying said selected characteristics of said power transmitted through said power lines, said display including
        a display screen and associated circuitry for receiving said output signals, and
        a housing having a front surface surrounding said display screen, and a rear surface adapted to be mounted on a flat panel and containing a connector coupled to said circuitry associated with said display screen and mating with said display connector on said first surface of said meter module housing so that said metering module and said display can be mounted on opposite sides of the same panel and connected to each other through an aperture in said panel.

2. The power monitoring system of claim 1 in which a meter base and said display include connectors for making a tethered connection between said meter base and said display.

3. The power monitoring system of claim 2 in which said first surface of said meter base housing contains a connector receiving said output signals.

4. A power monitoring system for monitoring characteristics of power transmitted through one or more power lines, said power monitoring system comprising
    a meter base including
        a processor and associated circuitry for processing signals derived from sensors coupled to said power lines and producing output signals representing selected characteristics of said power transmitted through said power lines, and
        a housing containing said processor and said associated circuitry and having a first surface adapted to be mounted on a support, and a second surface containing multiple connectors for receiving multiple modules and electrically connecting said modules to said processor and said associated circuitry, and
    multiple option modules each of which includes
        a housing having a first surface containing a connector that is complementary with said multiple connectors in said second surface of said meter base so that any of said option modules can be plugged into any of said multiple connectors in said second surface of said meter base, and
        circuitry within said housing of each option module for interconnecting with said processor and said associated circuitry in said meter base,
    wherein said meter base housing and said option module housings have a dimension that is an integer multiple of a predetermined dimension, so that said housings are all compatible and interchangeable with associated equipment having horizontal dimensions that are integer multiples of said predetermined dimension.

5. The power monitoring system of claim 4 in which said first surface of said meter base housing is adapted for optional mounting on DIN rail or a flat panel, and contains a connector for mating with a complementary connector on the opposite side of said flat panel through a hole in said flat panel, or mating with a complementary connector on said DIN rail.

6. A power monitoring system for monitoring characteristics of power transmitted through one or more power lines, said power monitoring system comprising
    a meter base including
        a processor and associated circuitry for processing signals derived from sensors coupled to said power lines and producing output signals representing selected characteristics of said power transmitted through said power lines, a housing containing said processor and said associated circuitry and having a first surface adapted to be mounted on a support, and a second surface containing multiple connectors for receiving multiple modules and electrically connecting said modules to said processor and said associated circuitry, and multiple option modules each of which includes a housing having a first surface containing a connector that is complementary with said multiple connectors in said second surface of said meter base so that any of said option modules can be plugged into any of said multiple connectors in said second surface of said meter base, and circuitry within said housing of each option module for interconnecting with said processor and said associated circuitry in said meter base, and a current-voltage module comprising a housing, at least one pair of terminals mounted on said housing for connecting said housing to said power lines, a voltage sensor contained in said housing and coupled to said terminals for producing a signal representing the voltage across said power lines, a current sensor contained in said housing and coupled to said terminals for producing a signal representing the current carried by said power lines, analog-to-digital converters contained in said housing and receiving said voltage and current signals for producing corresponding digital signals, and at least one digital signal output terminal receiving said corresponding digital signals from said analog-to-digital converters for supplying said digital signals to said processor for analyzing those digital signals.

7. The power monitoring system of claim 6 in which said current-voltage module further includes circuitry for converting an AC voltage on said power line to a low-voltage DC power output.

8. The power monitoring system of claim 6 in which said current-voltage module housing includes a surface forming a channel that is sized and shaped to mate with a complementary DIN rail for mounting said current-voltage module housing on said DIN rail.

9. The power monitoring system of claim 6 which includes multiple voltage sensors, current sensors and analog-to-digital converters, and said multiple analog-to-digital converters are daisy-chained to said digital signal output terminal to provide a serial output containing the outputs of all of said multiple analog-to-digital converters.

10. The power monitoring system of claim 6 in which said current sensor is a current transformer, and which further includes a burden resistor for said current transformer.

11. The power monitoring system of claim 6 in which said current-voltage module includes a voltage protection device for protecting the circuitry in said current-voltage module from voltage transients on said power lines.

12. The power monitoring system of claim 6 in which said current-voltage module is electrically coupled to, but physically separate from, said meter base.

\* \* \* \* \*